US011145624B2

United States Patent
Yen et al.

(10) Patent No.: US 11,145,624 B2
(45) Date of Patent: Oct. 12, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW); Kay Stefan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/523,787

(22) Filed: Jul. 26, 2019

(65) Prior Publication Data
US 2021/0028150 A1  Jan. 28, 2021

(51) Int. Cl.
| | |
|---|---|
| *H01L 25/065* | (2006.01) |
| *H01L 23/538* | (2006.01) |
| *H01L 23/31* | (2006.01) |
| *H01L 23/00* | (2006.01) |
| *H01L 25/00* | (2006.01) |
| *H01L 21/56* | (2006.01) |

(52) U.S. Cl.
CPC ........ *H01L 25/0657* (2013.01); *H01L 21/568* (2013.01); *H01L 23/3128* (2013.01); *H01L 23/3135* (2013.01); *H01L 23/5383* (2013.01); *H01L 23/5386* (2013.01); *H01L 24/16* (2013.01); *H01L 24/81* (2013.01); *H01L 25/50* (2013.01); *H01L 24/48* (2013.01); *H01L 24/73* (2013.01); *H01L 2224/16145* (2013.01); *H01L 2224/16227* (2013.01); *H01L 2224/48145* (2013.01); *H01L 2224/73207* (2013.01); *H01L 2224/81805* (2013.01); *H01L 2224/81815* (2013.01)

(58) Field of Classification Search
CPC ....... H01L 25/0657; H01L 2224/05568; H01L 25/18; H01L 2224/16145; H01L 23/3135; H01L 2224/48145
See application file for complete search history.

(56) References Cited

U.S. PATENT DOCUMENTS

| | | | |
|---|---|---|---|
| 2004/0036152 A1 | 2/2004 | Harper et al. | |
| 2004/0164390 A1* | 8/2004 | Wang | H01L 23/3128 257/686 |
| 2007/0069371 A1* | 3/2007 | Iksan | H01L 23/3128 257/706 |

(Continued)

*Primary Examiner* — Changhyun Yi
(74) *Attorney, Agent, or Firm* — Foley & Lardner LLP

(57) ABSTRACT

A semiconductor device package includes a substrate, a stacked structure and an encapsulation layer. The substrate includes a circuit layer, a first surface and a second surface opposite to the first surface. The substrate defines at least one cavity through the substrate. The stacked structure includes a first semiconductor die disposed on the first surface and electrically connected on the circuit layer, and at least one second semiconductor die stacked on the first semiconductor die and electrically connected to the first semiconductor die. The second semiconductor die is at least partially inserted into the cavity. The encapsulation layer is disposed in the cavity and at least entirely encapsulating the second semiconductor die.

21 Claims, 26 Drawing Sheets

(56) References Cited

U.S. PATENT DOCUMENTS

| | | | |
|---|---|---|---|
| 2009/0085178 A1* | 4/2009 | Ha | H01L 23/3121 257/666 |
| 2011/0215464 A1* | 9/2011 | Guzek | H01L 21/56 257/737 |
| 2014/0291859 A1* | 10/2014 | Kiwanami | H05K 1/185 257/774 |
| 2016/0081194 A1* | 3/2016 | Sato | H05K 3/4697 361/761 |
| 2017/0207200 A1* | 7/2017 | Lin | H01L 23/16 |

* cited by examiner

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor device package including a stacked structure partially embedded in a cavity of a substrate and encapsulated by an encapsulation layer, and a method for manufacturing the same.

2. Description of the Related Art

Stacked die structure has a thicker thickness, which impedes miniaturization of semiconductor device package. Attempts have been made to reduce the thickness of semiconductor device package by embedding the semiconductor die in a substrate; however, adequate molding of the embedded semiconductor die is not readily achieved, and a molding compound may pollute bonding pads of the substrate. In addition, an interposer is included to interconnect the semiconductor dies, which increases costs and thickness of the semiconductor device package.

SUMMARY

In some embodiments, a semiconductor device package includes a substrate, a stacked structure and an encapsulation layer. The substrate includes a circuit layer, a first surface and a second surface opposite to the first surface. The substrate defines at least one cavity through the substrate, and at least one recess recessed from the second surface and partially exposing the circuit layer. The stacked structure includes a first semiconductor die disposed on the first surface and electrically connected on the circuit layer, and at least one second semiconductor die stacked on the first semiconductor die and electrically connected to the first semiconductor die. The second semiconductor die is at least partially inserted into the cavity. The encapsulation layer us disposed in the cavity and at least encapsulating the second semiconductor die. The encapsulation layer further includes a protruding portion protruding out the cavity and partially covering the second surface of the substrate.

In some embodiments, a semiconductor device package includes a substrate, a stacked structure and an encapsulation layer. The substrate includes a circuit layer, a first surface and a second surface opposite to the first surface. The substrate defines at least one cavity through the substrate. The stacked structure includes a first semiconductor die disposed on the first surface and electrically connected on the circuit layer, and at least one second semiconductor die stacked on the first semiconductor die and electrically connected to the first semiconductor die. The second semiconductor die is at least partially inserted into the cavity. The encapsulation layer is disposed in the cavity and at least entirely encapsulating the second semiconductor die.

In some embodiments, a method for manufacturing a semiconductor device package includes following steps. A substrate defining a cavity is received. A stacked structure including a first semiconductor die and at least one second semiconductor die stacked on the first semiconductor die is received. The first semiconductor die is bonded to a first surface of the substrate with the second semiconductor die at least being partially inserted into the cavity. A molding material is filled in the cavity to form an encapsulation layer in the cavity to at least entirely encapsulate the second semiconductor die.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
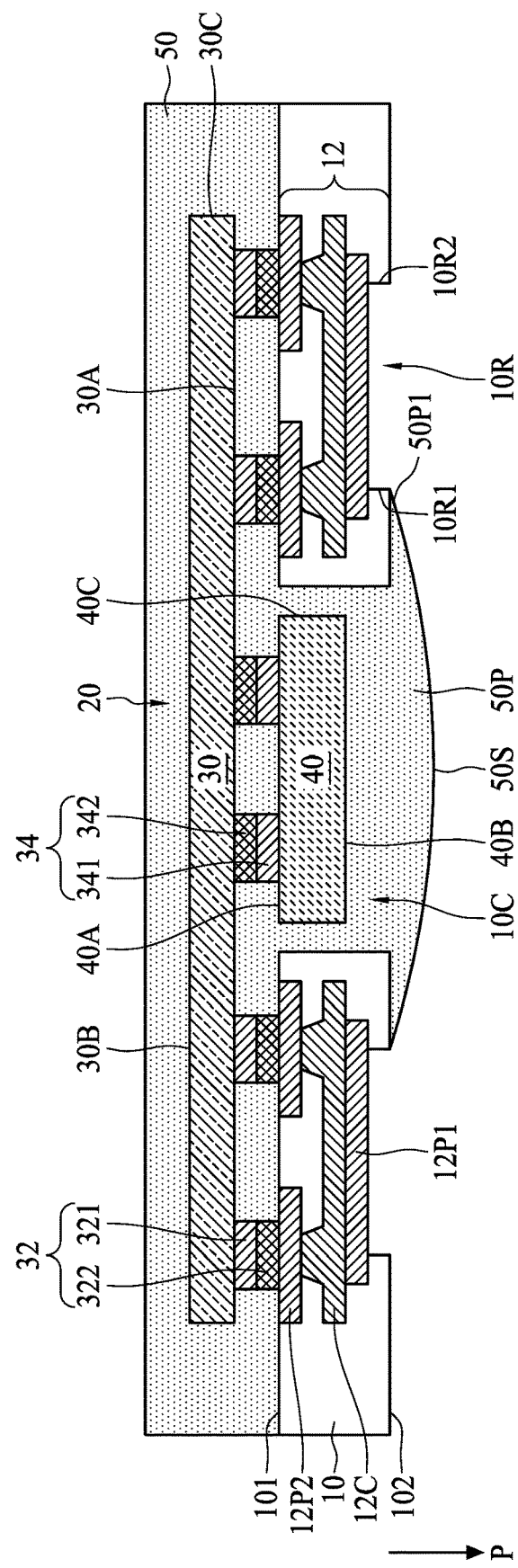
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "leveled with" may be used to describe one element or feature's surface is substantially coplanar with another one element or feature's surface. As used herein the term "aligned with" may be used to describe one element or feature's edge is substantially coplanar with another one element or feature's edge.

Figure 1A:
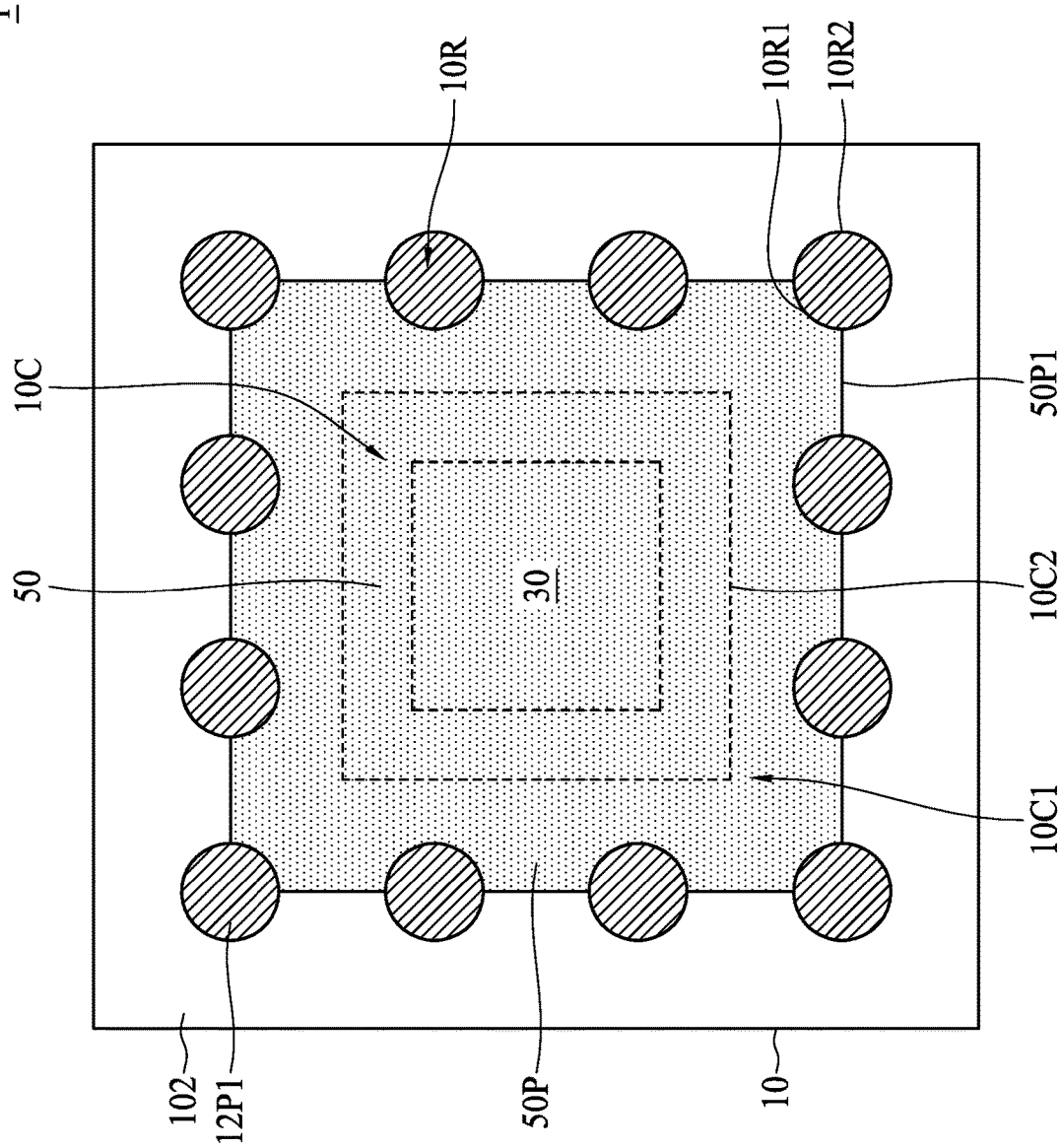
FIG. 1A is a bottom view of a semiconductor device package of FIG. 1 in accordance with some embodiments of the present disclosure.

FIG. 1 is a cross-sectional view of a semiconductor device package 1 in accordance with some embodiments of the present disclosure, and FIG. 1A is a bottom view of a semiconductor device package 1 of FIG. 1 in accordance with some embodiments of the present disclosure. As shown in FIG. 1 and FIG. 1A, the semiconductor device package 1 includes a substrate 10, a stacked structure 20 and an encapsulation layer 50. The substrate 10 includes a first surface 101 e.g., an upper surface, and a second surface 102 e.g., a bottom surface opposite to the first surface 101. The substrate 10 includes a circuit layer 12. In some embodiments, the base material of the substrate 10 may include dielectric material, insulating material or semiconductor material. For example, the substrate 10 may include an organic substrate such as a core substrate, a coreless substrate, or other suitable substrate. In some embodiments, the circuit layer 12 may include one or more conductive layers 12C stacked on and electrically connected to each other. The circuit layer 12 may further include bonding pads (which may also be referred to as contact pads, under bump metallurgy (UBM) or a combination thereof) 12P1 disposed on, adjacent to, or embedded in and exposed by the second surface 102, and bonding pads ((which may also be referred to as contact pads, under bump metallurgy (UBM) or a combination thereof) 12P2 disposed on, adjacent to, or embedded in and exposed by the first surface 101. The bonding pads 12P1 and the bonding pads 12P2 may be electrically connected to the conductive layer(s) 12C. The substrate 10 may define at least one cavity 10C through the substrate 10. The cavity 10C may include a polygonal shape such as rectangular shape as shown in FIG. 1A, a circular shape, or other shape. The substrate 10 may further define at least one recess 10R recessed from the second surface 102 and partially exposing the circuit layer 12. For example, the recess 10R may partially expose the bonding pad 12P1 of the circuit layer 12. The recess 10R may include a circular shape as shown in FIG. 1A, a polygonal shape such as rectangular shape, or other shape. In some embodiments, a peripheral region of the bonding pad 12P1 may be covered by the substrate 10, and the central region of the bonding pad 12P1 may be exposed by the substrate 10. In some embodiments, the bonding pads 12P1 may be recessed from the second surface 102 of the substrate 10 through the recess 10R. In some embodiments, the bonding pads 12P2 may be substantially leveled with the first surface 101 of the substrate 10. The recess 10R may include a first lateral edge 10R1 proximal to the cavity 10C, and a second lateral edge 10R2 distal to the cavity 10C.

The stacked structure 20 includes at least one first semiconductor die 30 and at least one second semiconductor die 40. The first semiconductor die is disposed on the first surface 101 of the substrate 10 and electrically connected on the circuit layer 12. The second semiconductor die 40 is stacked on the first semiconductor die 30 and electrically connected to the first semiconductor die 30. The second semiconductor die 40 is at least partially inserted into the cavity 10C. For example, the second semiconductor die 40 may be partially or entirely inserted into the cavity 10C such that the thickness of the semiconductor device package 1 can be reduced. In some embodiments, the first semiconductor die 30 and the second semiconductor die 40 may include different types of semiconductor dies. By way of example, the first semiconductor die 30 may include system on chip (SOC) die, and the at least one second semiconductor die 40 may include memory die such as high bandwidth memory (HBM) die. The first semiconductor die 30 and the second semiconductor die 40, however, each may include an active die or a passive die.

The semiconductor device 1 may further include a plurality of interconnection structures 32 disposed between the first surface 101 of the substrate 10 and the first semiconductor die 30, and electrically connecting first semiconductor die 30 to the circuit layer 12. In some embodiments, the interconnection structure 32 may, for example but is not limited to include, a conductive bump 321 and a solder 322. The conductive bump 321 such as micro bump, conductive pillar, conductive stud or the like may be disposed on and electrically connected to the first semiconductor die 30. The solder 322 such as solder bump, solder paste or the like may be disposed between the conductive bump 321 and the bonding pad 12P2, and electrically connecting the conductive bump 321 to the bonding pad 12P2. In some embodiments, the locations of the conductive bump 321 and the solder 322 may be interchanged, and the interconnection structure 32 may additionally include other conductive structure such as UBM or the like.

The stacked structure 20 may include a kangaroo die structure in which the first semiconductor die 30 and the second semiconductor dies 40 are bonded and electrically connected to each other in advance prior to being inserted into the cavity 10C. In some embodiments, the first semiconductor die 30 may be configured as a parent die, and the second semiconductor die 40 may be configured as a child die. The first semiconductor die 30 and the second semiconductor dies 40 each may include integrated circuit (IC). The first semiconductor die 30 and the second semiconductor dies 40 each may include redistribution layer (RDL) with compatible line width/spacing (L/S) and pitch, and thus the first semiconductor die 30 and the second semiconductor dies 40 can directly communicate with each other. The first semiconductor die 30 and the second semiconductor dies 40 may be formed by semiconductor fabrication and apparatus, and the L/S of the first semiconductor die 30 and the second semiconductor dies 40 can be reduced to less than about 10 μm/about 102 μm or even about 2 μm/about 2 μm, for example. The electrical connection between the first semiconductor die 30 and the second semiconductor die 40 may be a substrate-free connection in which additional interposer or interconnection substrate may be omitted. Accordingly, the electrical transmission path as well as the thickness of the stacked structure 20 can be reduced, and the I/O connections can be increased. In some embodiments, the active surface (e.g., front surface) 30A of the first semiconductor die 30 faces the active surface 40A of the second semiconductor die 40. The semiconductor device 1 may further include a plurality of conductive structures 34 disposed between the active surface 40A of the second semiconductor die 40 and the active surface 30A of the first semiconductor die 30, and electrically connecting the second semiconductor die 40 to the first semiconductor die 30.

In some embodiments, the conductive structure 34 may, for example but is not limited to include, a conductive bump 341 and a solder 342. The conductive bump 341 such as micro bump, conductive pillar, conductive stud or the like may be disposed on and electrically connected to the active surface 40A of the second semiconductor die 40. The solder 342 such as solder bump, solder paste or the like may be disposed between the conductive bump 341 and the active surface 30A of the first semiconductor die 30, and electrically connecting the conductive bump 342 to the first semiconductor die 30. In some embodiments, the locations of the conductive bump 341 and the solder 342 may be interchanged, and the conductive structure 34 may additionally include other conductive structure such as under metallurgy (UBM) or the like. Since the L/S of the first semiconductor die 30 and the second semiconductor dies 40 can be reduced, the conductive structures 34 can include micro conductive structures. Accordingly, the yield and density of the conductive structures 34 can be improved.

In some embodiments, the melting point of the conductive structures 34 is different form the melting point of the interconnection structures 32. By way of example, the melting point of the conductive structures 34 is higher than the melting point of the interconnection structures 32 such that the conductive structures 34 are not soften or melted during a reflow process of the interconnection structures 32. In some embodiments, the melting point of the solder 342 of the conductive structure 34 is higher than the melting point of the solder 322 of the interconnection structure 32. For example, the melting point of the solder 342 of the conductive structure 34 is higher than about 280° C. or higher than 300° C., and the melting point of the solder 322 of the interconnection structure 32 is lower than about 280° C. or lower than 260° C. An example of the material of the solder 342 may include an alloy of gold (Au) and tin (Sn), and an example of the material of the solder 322 may include an alloy of tin (Sn) and lead (Pb) or an alloy of tin (Sn), silver (Ag) and copper (Cu).

The encapsulation layer 50 is disposed in the cavity 10C and at least encapsulates the second semiconductor die 40. The encapsulation layer 50 may entirely encapsulate the second semiconductor die 40. For example, the encapsulation layer 50 may encapsulate the active surface 40A, the passive surface (e.g., back surface) 40B and the sidewalls 40C of second semiconductor die 40. The encapsulation layer 50 may be configured as a molding underfill (MUF), and disposed between the first semiconductor die 30 and the second semiconductor die 40 to encapsulate the conductive structures 34. The encapsulation layer 50 may further encapsulate the sidewalls 30C of the first semiconductor die 30. The encapsulation layer 50 may also encapsulate the passive surface 30B of the first semiconductor die 30. The material of the encapsulation layer 50 may include molding compound such as epoxy resin or the like. In some embodiments, the encapsulation layer 50 may further include fillers such as silicon oxide fillers or the like.

The encapsulation layer 50 further includes a protruding portion 50P protruding out the cavity 10C and at least partially covering the second surface 102 of the substrate 102. The bonding pad 12P1 may partially overlap with the protruding portion 50P of the encapsulation layer 50 in a vertical projection direction P. In some embodiments, a first edge 50P1 of protruding portion 50P of the encapsulation layer 50 is substantially aligned with the first lateral edge 10R1 of the recess 10R. As shown in FIG. 1A, the length and shape of the first lateral edges 50P1 of different recesses 10R may be different. For example, the first lateral edge 10R1 of a recess 10R such as the recess 10R corresponding to a corner 10C1 of the cavity 10C may be one fourth of the circumference of the recess 10R, while the first lateral edge 10R1 of a recess 10R such as the recess 10R corresponding to a side 10C2 of the cavity 10C may be half of the circumference of the recess 10R. In some embodiments, the protruding portion 50P of the encapsulation layer 50 may include a non-planar surface 50S. By way of example, the non-planar surface 50S may include a convex surface. In some other embodiments, the non-planar surface 50S may include a concave surface, a rough surface or other regular or irregular shapes. In some other embodiments, the protruding portion 50P of the encapsulation layer 50 may include a planar surface or a combination of planar surface and non-planar surface.

In some embodiments of the present disclosure, the semiconductor device package 1 includes the stacked structure 20 partially inserted into the cavity 10C of the substrate 10 such that the thickness of the semiconductor device package 1 can be reduced. The stacked structure 20 is encapsulated and protected by the encapsulation layer 50, and thus the reliability of the semiconductor device package 1 can be improved. The stacked structure 20 includes the first semiconductor die 30 and the second semiconductor die 40 stacked to and electrically connected to each other. The electrical connection between the first semiconductor die 30 and the second semiconductor dies 40 may be a substrate-free connection in which additional interposer or interconnection substrate may be omitted. Accordingly, the electrical transmission path of the stacked structure 20 can be shortened, the thickness of the semiconductor device package 1 can be further reduced, and the I/O connections can be increased.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 2A:
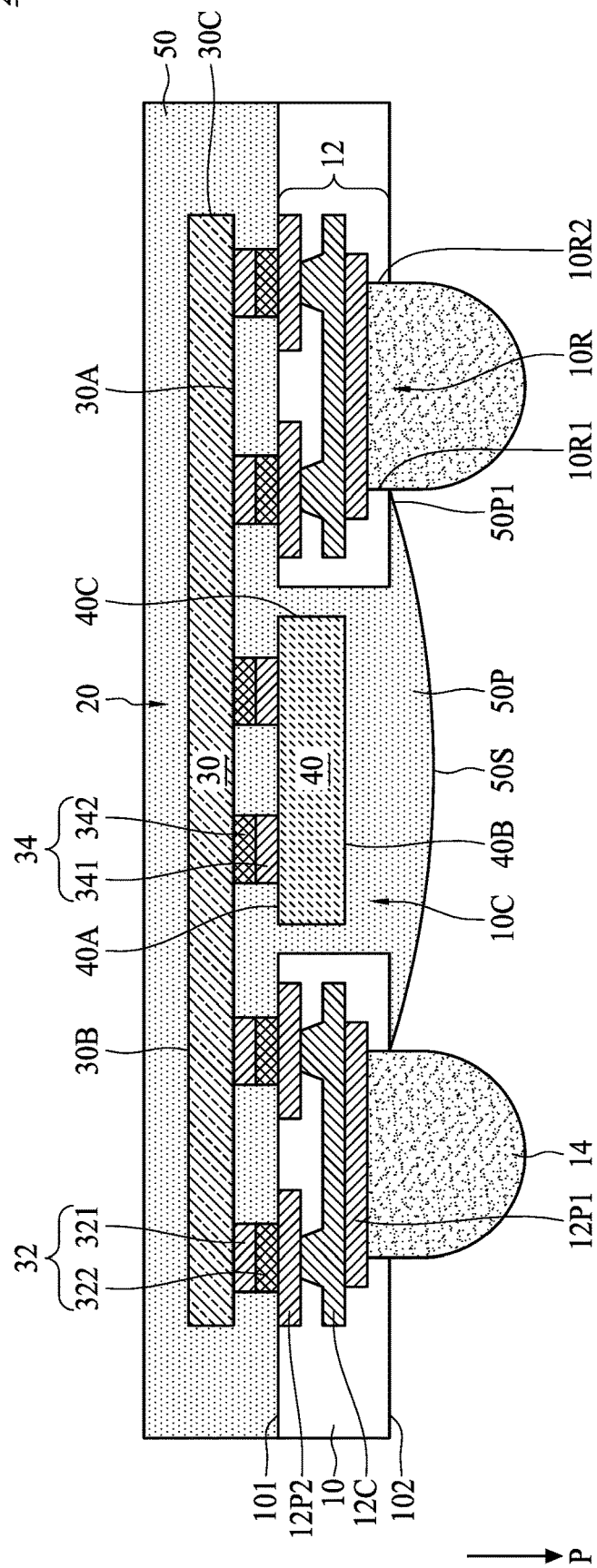
FIG. 2A is a cross-sectional view of a semiconductor device package in accordance with some embodiments of the present disclosure.

FIG. 2A is a cross-sectional view of a semiconductor device package 2A in accordance with some embodiments of the present disclosure. In contrast to the semiconductor device package 1 in FIG. 1, the semiconductor device package 2A may further include at least one electrical conductor 14 disposed on the second surface 102 of the substrate 10 and electrically connected to the circuit layer 12 through the recess 10R. In some embodiments, the electrical conductor 14 may include a solder ball or the like.

Figure 2B:
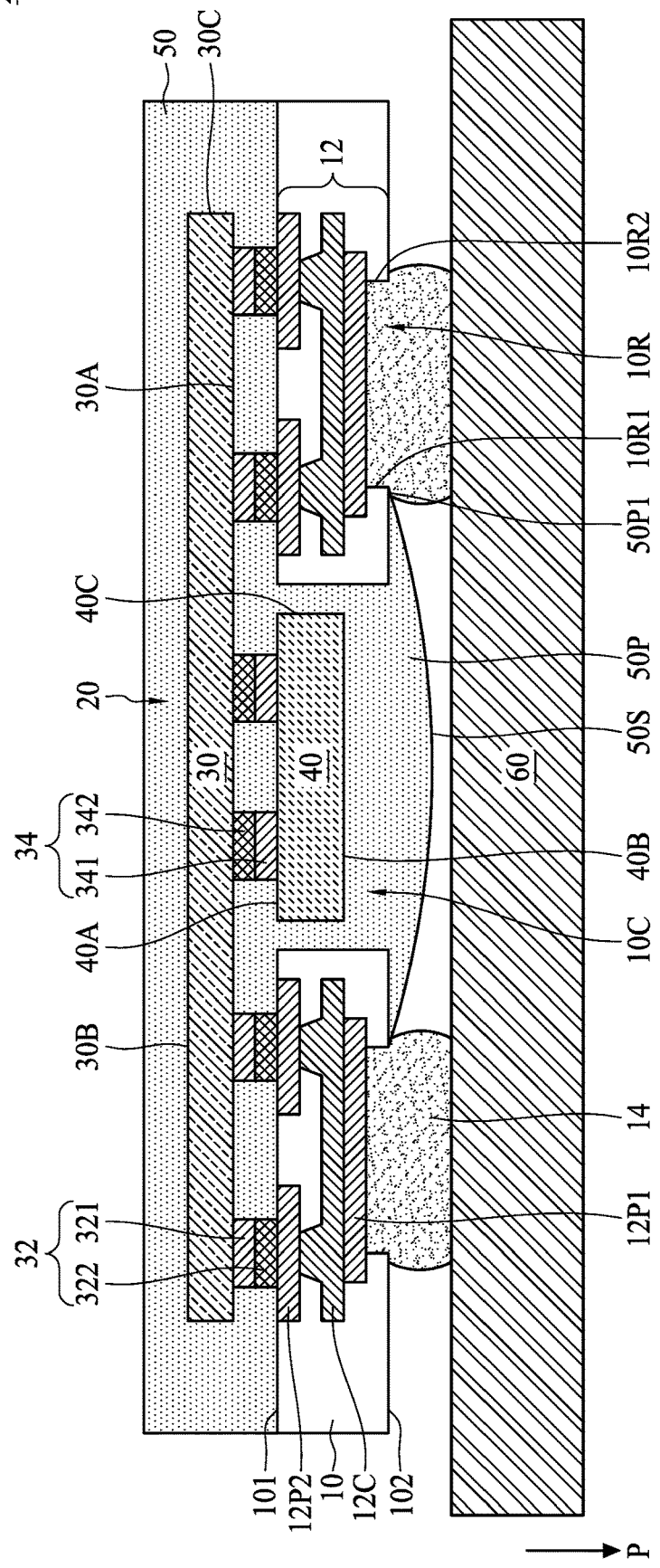
FIG. 2B is a cross-sectional view of a semiconductor device package in accordance with some embodiments of the present disclosure.

FIG. 2B is a cross-sectional view of a semiconductor device package 2B in accordance with some embodiments of the present disclosure. In contrast to the semiconductor device package 2A in FIG. 2A, the semiconductor device package 2B may further include a package substrate 60 such as a printed circuit board (PCB) or the like. The substrate 10 may be bonded to the package substrate 60 through the electrical conductor 14. The protruding portion 50P may be in contact with the package substrate 60 or apart from the package substrate 60.

Figure 2C:
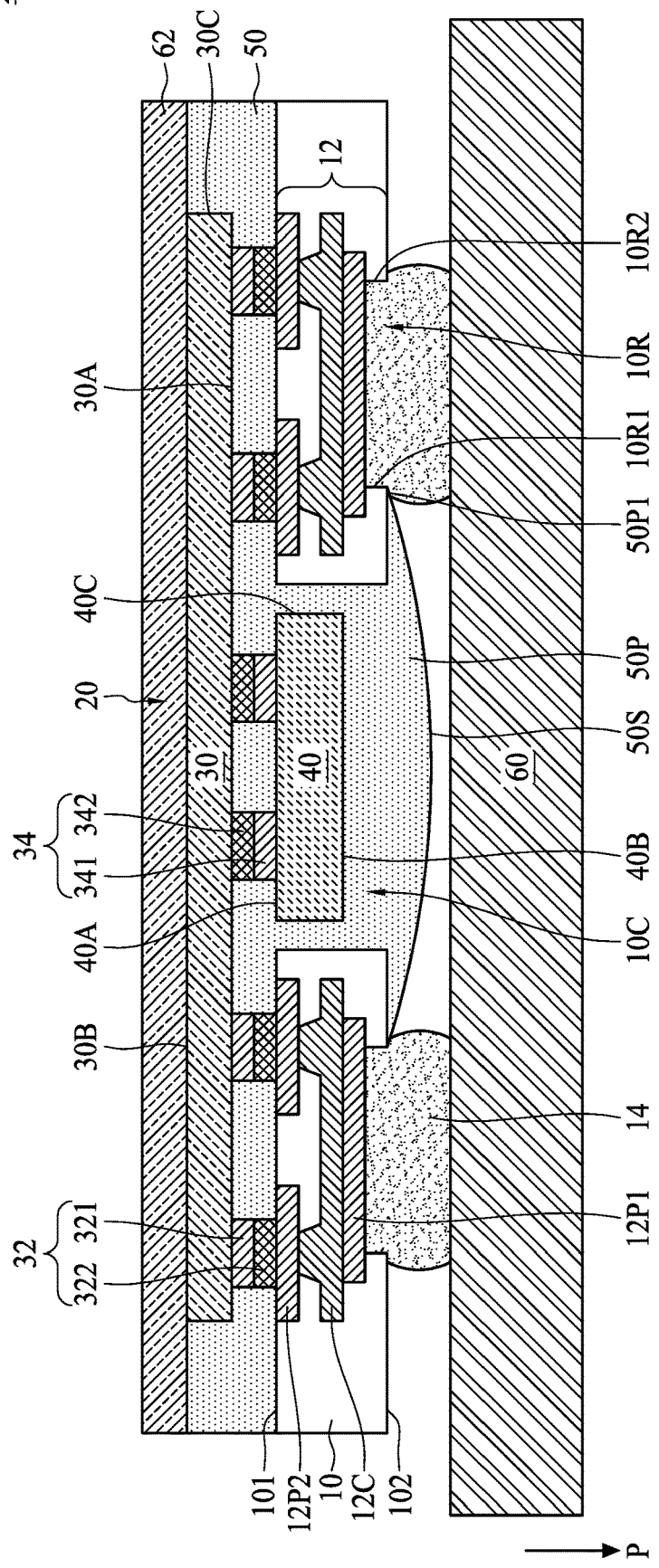
FIG. 2C is a cross-sectional view of a semiconductor device package in accordance with some embodiments of the present disclosure.

FIG. 2C is a cross-sectional view of a semiconductor device package 2C in accordance with some embodiments of the present disclosure. In contrast to the semiconductor device package 1 in FIG. 1, the encapsulation layer 50 may expose the passive surface 30B of the first semiconductor die 30. The semiconductor device package 2C may further include a heat dissipation layer 62 disposed on the passive surface 30B of the first semiconductor die 30 to improve heat dissipation effect. In some embodiments, the coefficient of thermal expansion (CTE), the modulus of elasticity and/or the thickness of the heat dissipation layer 62 can be such selected to alleviate stress and warpage. The material of the heat dissipation layer 62 may include conductive material such as metal, insulating material or other suitable materials.

Figure 2D:
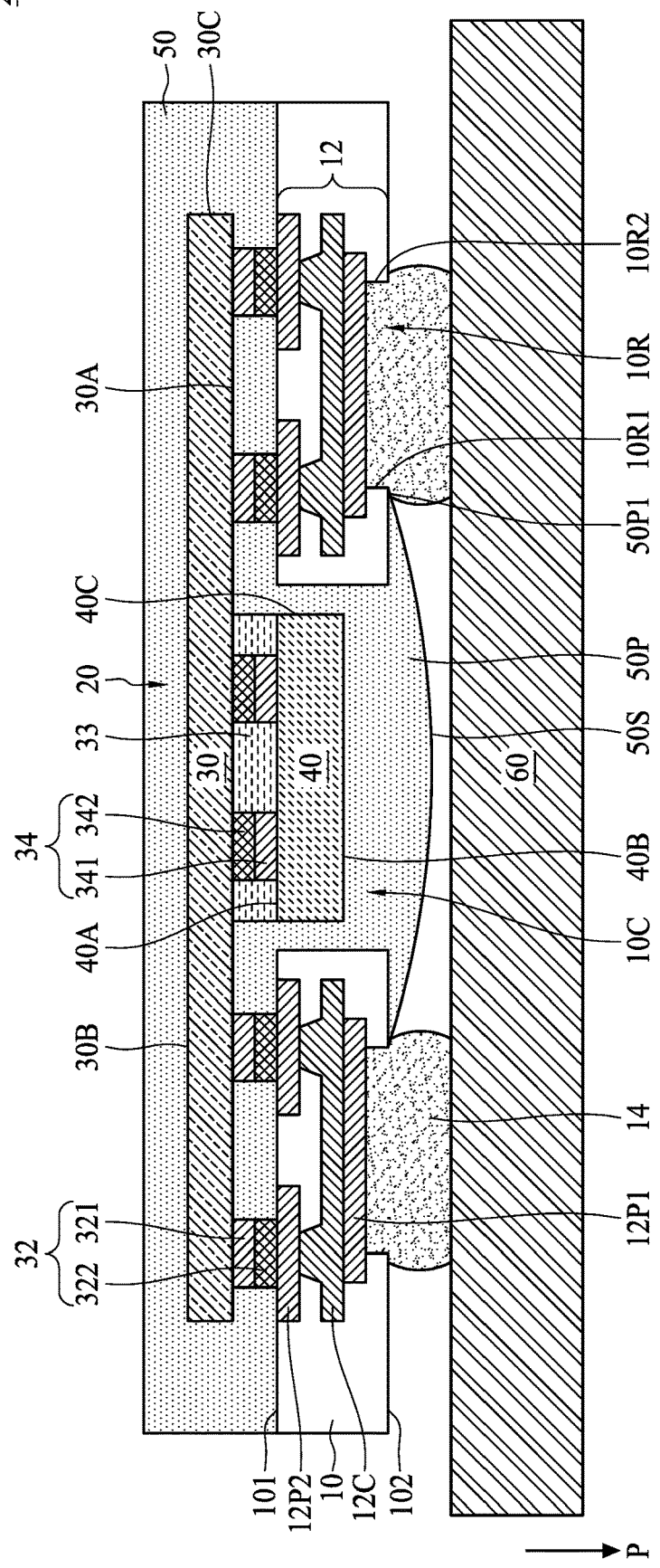
FIG. 2D is a cross-sectional view of a semiconductor device package in accordance with some embodiments of the present disclosure.

FIG. 2D is a cross-sectional view of a semiconductor device package 2D in accordance with some embodiments of the present disclosure. In contrast to the semiconductor device package 1 in FIG. 1, the semiconductor device package 2D may include an underfill layer 33 disposed between the active surface 40A of the second semiconductor die 40 and the active surface 30A of the first semiconductor die 30, and surrounding the conductive structures 34. In some embodiments, the melting point of the interconnection structures 32 may be the same as or different form the melting point of the conductive structures 34. For example, the melting point of the solder 322 of the interconnection structure 32 may be the same as or different from the melting point of the solder 342 of the conductive structure 34. The underfill layer 33 surrounding the conductive structures 34 can protect the conductive structures 34 from being deformed during a reflow process of the interconnection structures 32.

Figure 2E:
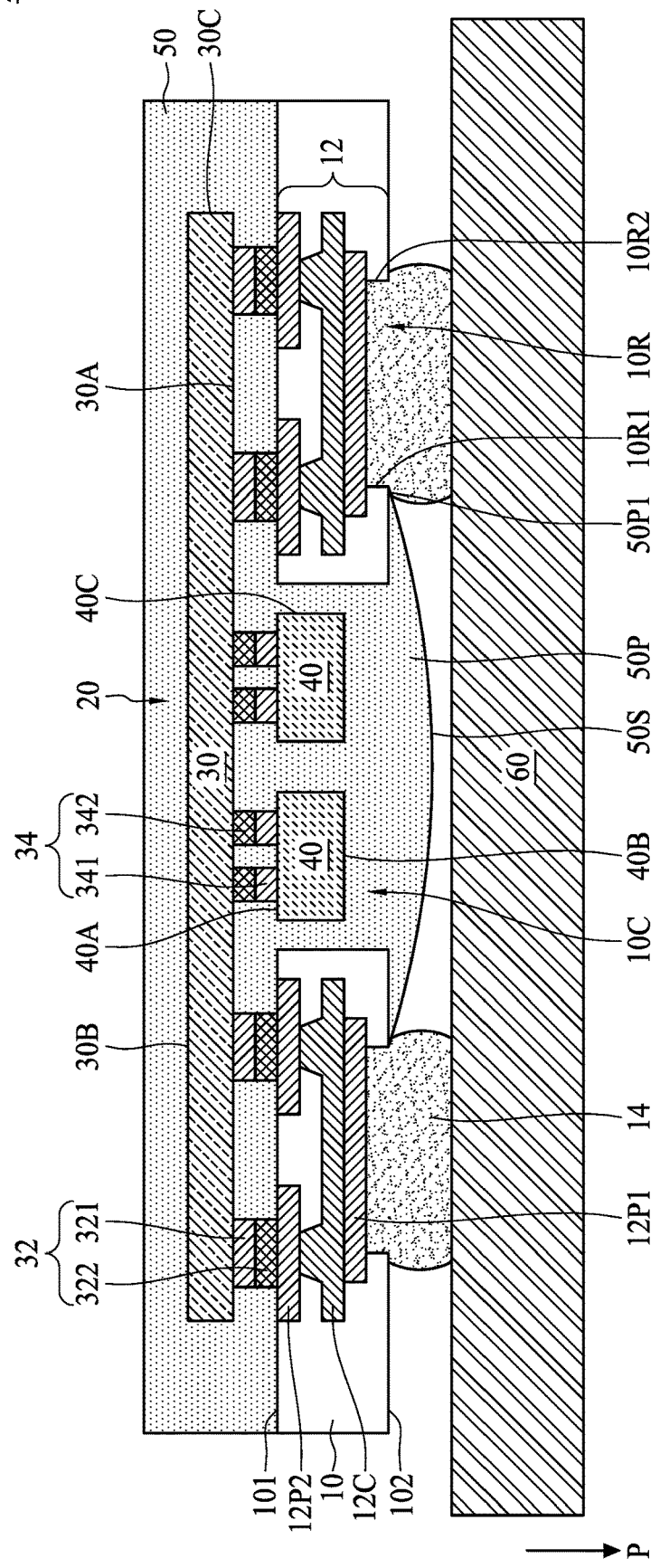
FIG. 2E is a cross-sectional view of a semiconductor device package in accordance with some embodiments of the present disclosure.

FIG. 2E is a cross-sectional view of a semiconductor device package 2E in accordance with some embodiments of the present disclosure. In contrast to the semiconductor device package 1 in FIG. 1, the stacked structure 20 may include two or more second semiconductor dies 40 stacked on the first semiconductor die 30. In some embodiments, the second semiconductor dies 40 may be disposed in the same cavity 10C. In some embodiments, the semiconductor dies 40 may be arranged side by side at substantially the same level, and each of the second semiconductor dies 40 may be in communication with each other through the first semiconductor die 30.

Figure 2F:
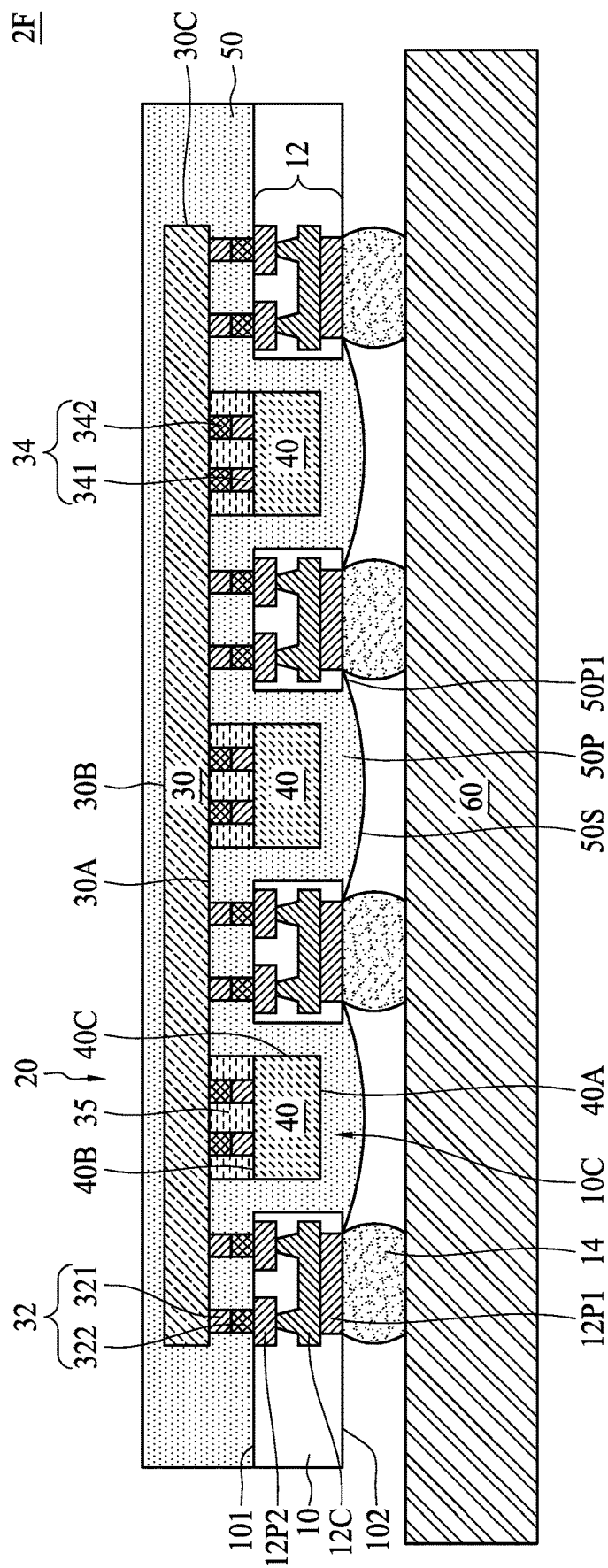
FIG. 2F is a cross-sectional view of a semiconductor device package in accordance with some embodiments of the present disclosure.

FIG. 2F is a cross-sectional view of a semiconductor device package 2F in accordance with some embodiments of the present disclosure. In contrast to the semiconductor device package 2E in FIG. 2E, the plurality of second semiconductor dies 40 may be disposed in different cavities 10C, and electrically connected to the same first semiconductor die 30.

Figure 2G:
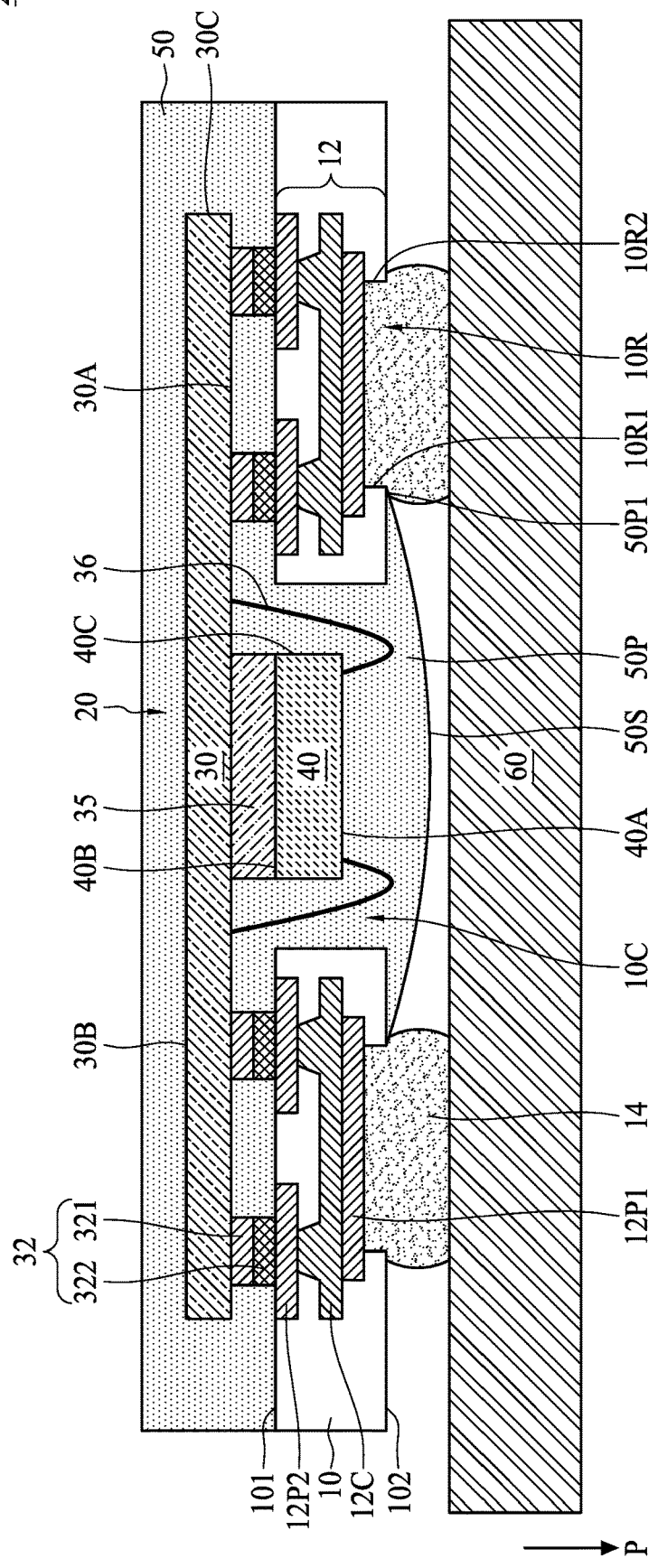
FIG. 2G is a cross-sectional view of a semiconductor device package in accordance with some embodiments of the present disclosure.

FIG. 2G is a cross-sectional view of a semiconductor device package 2G in accordance with some embodiments of the present disclosure. In contrast to the semiconductor device package 1 in FIG. 1, the active surface 30A of the first semiconductor die 30 faces the passive surface 40B of the second semiconductor die 40. The passive surface 40B of the second semiconductor die 40 may be attached to the active surface 30A of the first semiconductor die 30 by a die attach film (DAF) 35, for example. The semiconductor device package 2G may include of bonding wires 36, instead of the conductive structures 34, to electrically connect the second semiconductor die 40 to the first semiconductor die 30.

Figure 2H:
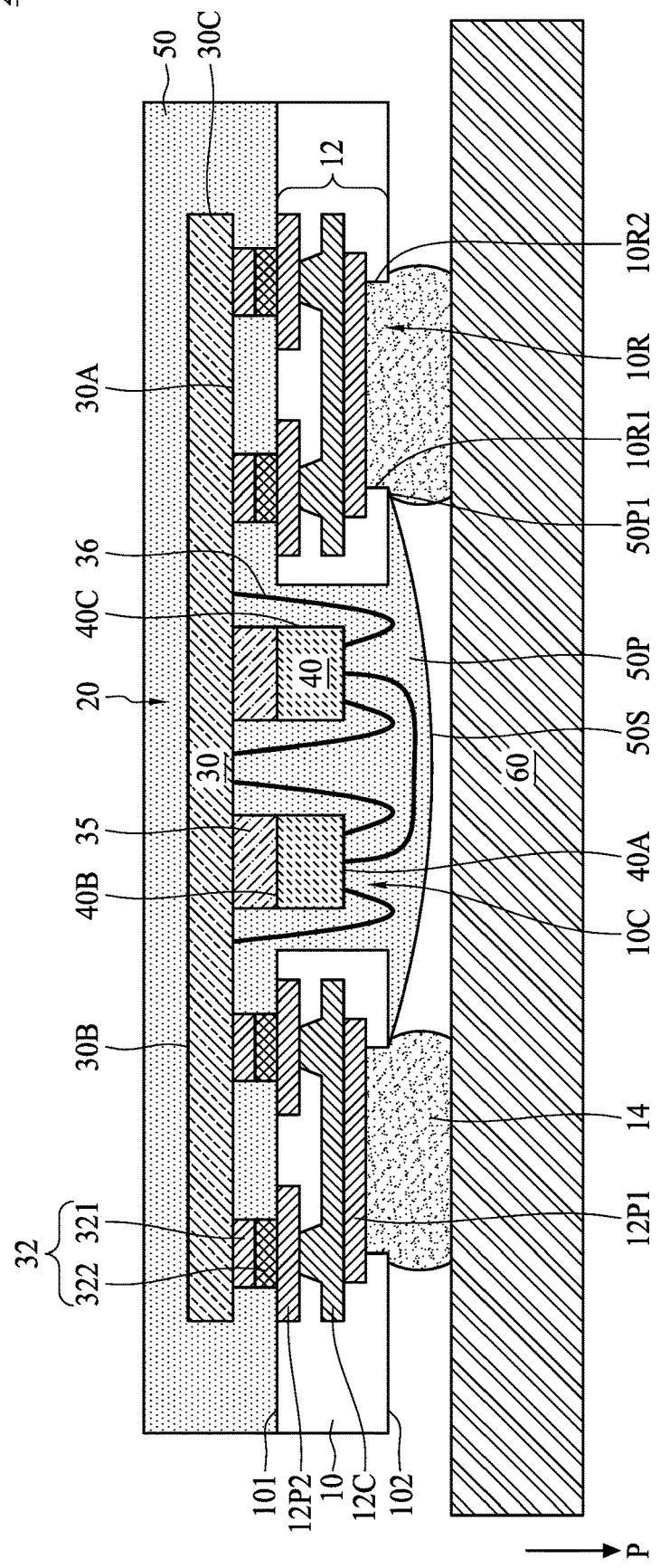
FIG. 2H is a cross-sectional view of a semiconductor device package in accordance with some embodiments of the present disclosure.

FIG. 2H is a cross-sectional view of a semiconductor device package 2H in accordance with some embodiments of the present disclosure. In contrast to the semiconductor device package 2G in FIG. 2G, the stacked structure 20 may include two or more second semiconductor dies 40 stacked on the first semiconductor die 30. In some embodiments, the second semiconductor dies 40 may be disposed in the same cavity 10C. In some embodiments, the semiconductor dies 40 may be arranged side by side at substantially the same level, and each of the second semiconductor dies 40 may be electrically connected to the first semiconductor die 30 through a portion of the bonding wires 36. The second semiconductor dies 40 may also be in communication with each other through another portion of the bonding wires 36.

Figure 2I:
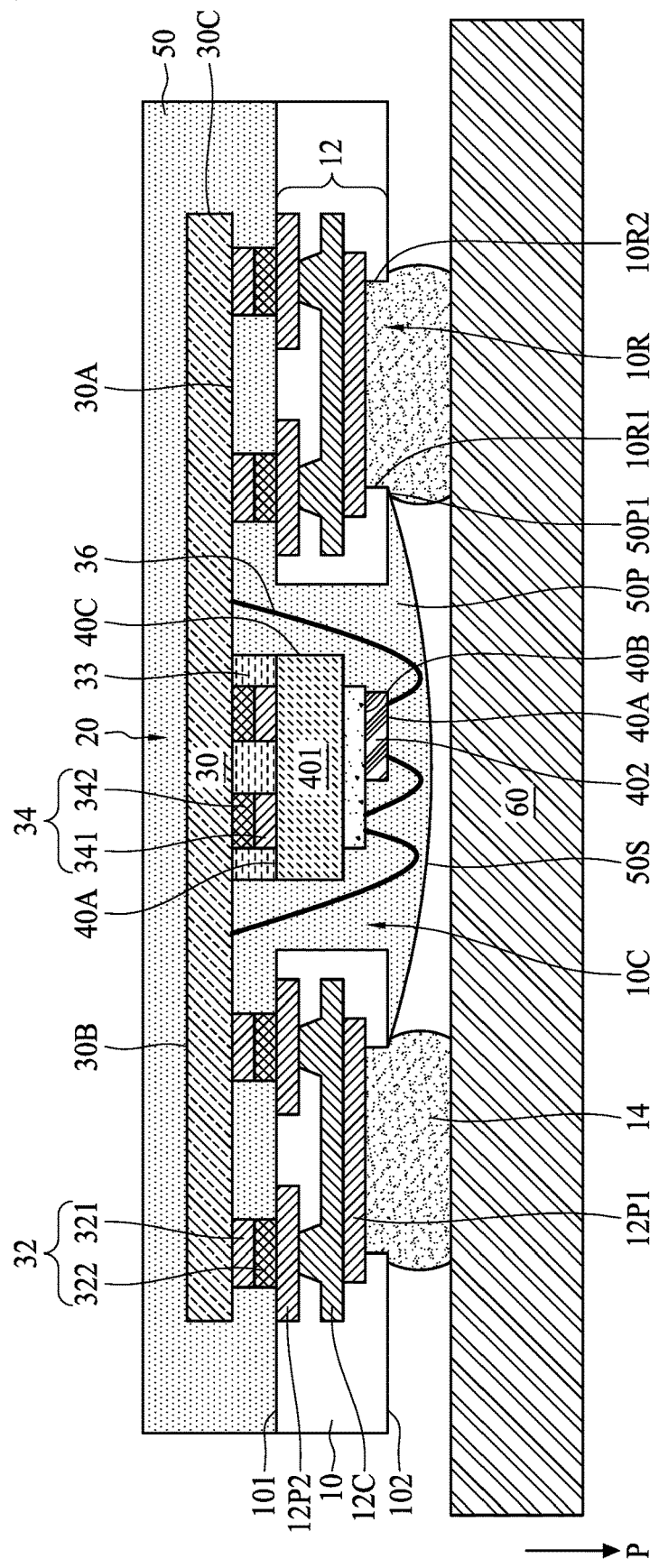
FIG. 2I is a cross-sectional view of a semiconductor device package in accordance with some embodiments of the present disclosure.

FIG. 2I is a cross-sectional view of a semiconductor device package 2I in accordance with some embodiments of the present disclosure. In contrast to the semiconductor device package 2H in FIG. 2H, the stacked structure 20 may include two or more second semiconductor dies 40 stacked on each other. A first set 401 of the second semiconductor dies 40 is electrically connected to the first semiconductor die 30 through conductive structures 34, and the active surface 40A of first set 401 of the second semiconductor dies 40 faces the active surface 30A of the first semiconductor die 30. A second set 402 of the second semiconductor dies 40 may be stacked on the first set 401 of the second semiconductor dies 40, and the passive surface 40B of second set 401 of the second semiconductor dies 40 faces the passive surface 40B of the first set 401 of the second semiconductor dies 40. The second set 402 of the second semiconductor dies 40 may be electrically connected to the first set 401 of the second semiconductor dies 40 and/or electrically connected to the first semiconductor die 30 through bonding wires 36.

Figure 3:
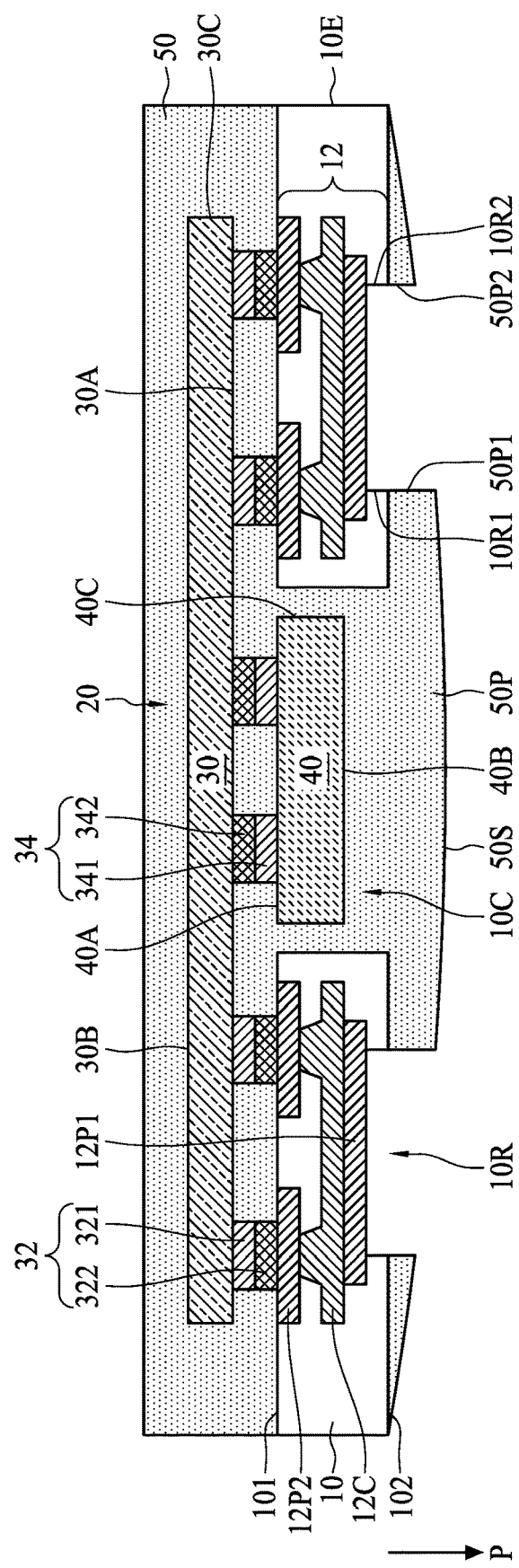
FIG. 3 is a cross-sectional view of a semiconductor device package in accordance with some embodiments of the present disclosure.
Figure 3A:
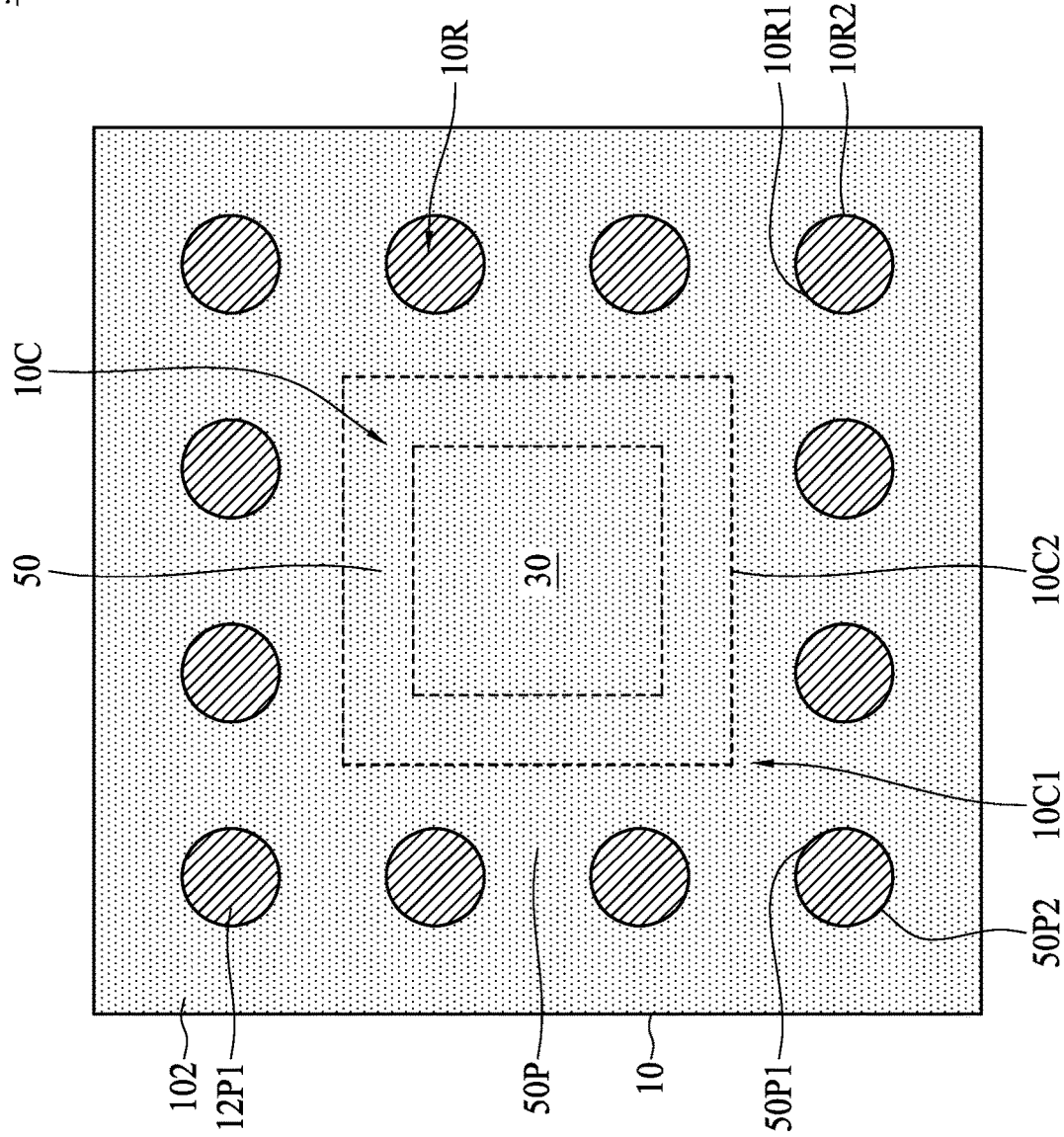
FIG. 3A is a bottom view of a semiconductor device package of FIG. 3 in accordance with some embodiments of the present disclosure.

FIG. 3 is a cross-sectional view of a semiconductor device package 3 in accordance with some embodiments of the present disclosure, and FIG. 3A is a bottom view of a semiconductor device package 5 of FIG. 3 in accordance with some embodiments of the present disclosure. In contrast to the semiconductor device package 1 in FIG. 1, the protruding portion 50P of the encapsulation layer 50 may be extended outwardly to be further disposed between the second lateral edge 10R2 of the recess 10R and a perimeter 10E of the substrate 10. The protruding portion 50P may include a first edge 50P1 adjacent to the first lateral edge 10R1 of the recess 10R, and a second edge 50P2 adjacent to the second lateral edge 10R2 of the recess 10R. In some embodiments, the first edge 50P1 of protruding portion 50P is substantially aligned with the first lateral edge 10R1 of the recess 10R, and the second edge 50P2 of protruding portion 50P is substantially aligned with the second lateral edge 10R2 of the recess 10R. The outer edge 50PE of the protrusion portion 50P may be substantially aligned with the perimeter 10E of the substrate 10, or may be recessed from the perimeter 10E of the substrate 10. The semiconductor device package 3 may be modified to further include a heat dissipation layer 62 and/or an underfill layer 33, to alter the connections between the first semiconductor die 30 and the second semiconductor die(s) 40, and to alter the location of the second semiconductor die(s) 40 with respect to the cavity 10C in manners similar to those embodiments as illustrated in FIGS. 2A-2I.

Figure 4:
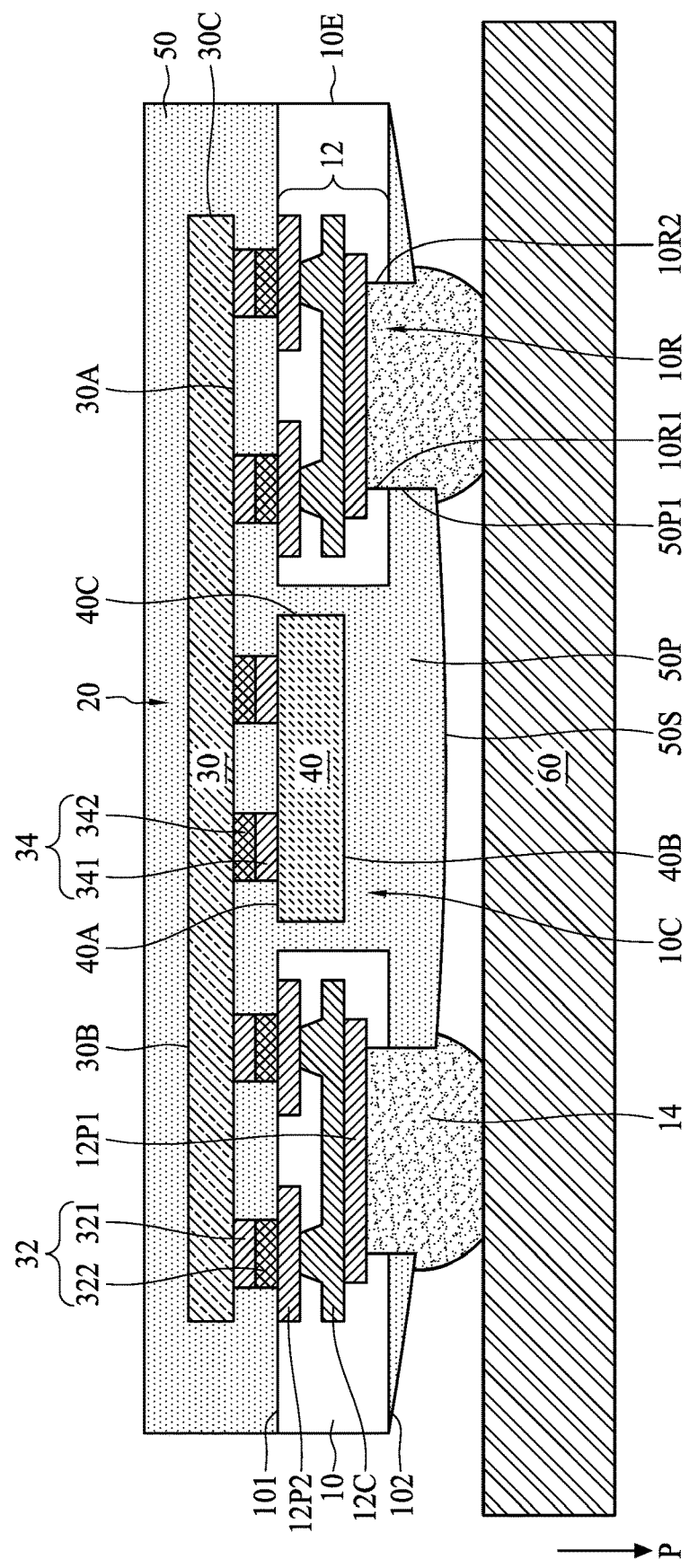
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. In contrast to the semiconductor device package 3 in FIG. 3, the semiconductor device package 4 may further include at least one electrical conductor 14 disposed on the second surface 102 of the substrate 10 and electrically connected to the circuit layer 12 through the recess 10R. In some embodiments, the electrical conductor 14 may include a solder ball or the like. In some embodiments, the semiconductor device package 4 may further include a package substrate 60 such as a printed circuit board or the like. The semiconductor device package 4 may be modified to further include heat dissipation layer 62 and/or an underfill layer 33, to alter the connections between the first semiconductor die 30 and the second semiconductor die(s) 40, and to alter the location of the second semiconductor die(s) 40 with respect to the cavity 10C in manners similar to those embodiments as illustrated in FIGS. 2A-2I.

Figure 5A:
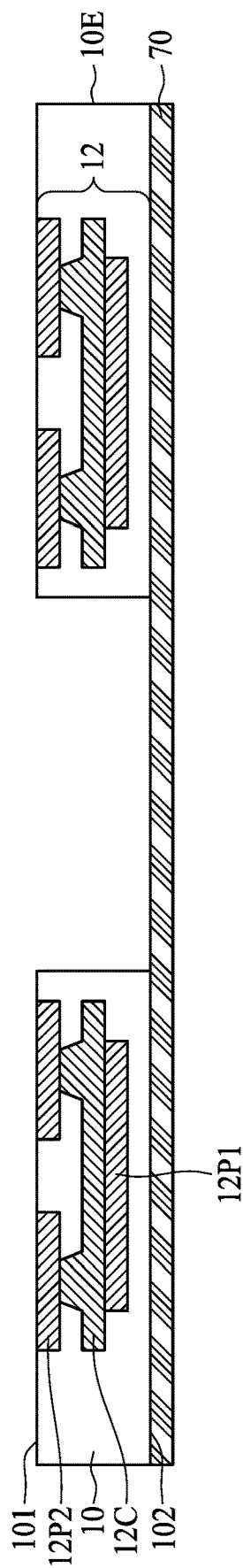
FIG. 5A, FIG. 5B, FIG. 5C, FIG. 5D and FIG. 5E illustrate operations of manufacturing a semiconductor device package in accordance with some embodiments of the present disclosure.

FIG. 5A, FIG. 5B, FIG. 5C, FIG. 5D and FIG. 5E illustrate operations of manufacturing a semiconductor device package in accordance with some embodiments of the present disclosure. As shown in FIG. 5A, a substrate 10 is received. The substrate 10 may include pre-formed circuit layer 12. The substrate 10 defines at least one cavity 10C through the substrate 10. The substrate 10 may further include a circuit layer 12. The circuit layer 12 may include bonding pads 12P1 adjacent to a second surface 102 of the substrate 10, and bonding pads 12P2 adjacent to a first surface 101 of the substrate 10. In some embodiments, the bonding pads 12P1 are embedded in the substrate 10, and unexposed from the second surface 102. In some other embodiments, the bonding pads 12P1 may be exposed from the second surface 102 of the substrate 10, but covered with a temporary passivation layer. The bonding pads 12P2 may be exposed from the first surface 101 of the substrate 10. In some embodiments, a supporter 70 is attached to the second surface 102 of the substrate 10 to seal a bottom of the cavity 10C. In some embodiments, the supporter 70 may include, but is not limited to be, a flexible supporter. For example, the flexible supporter may include a tape such as Ajinomoto Build-up Film (ABF) or the like.

Figure 5B:
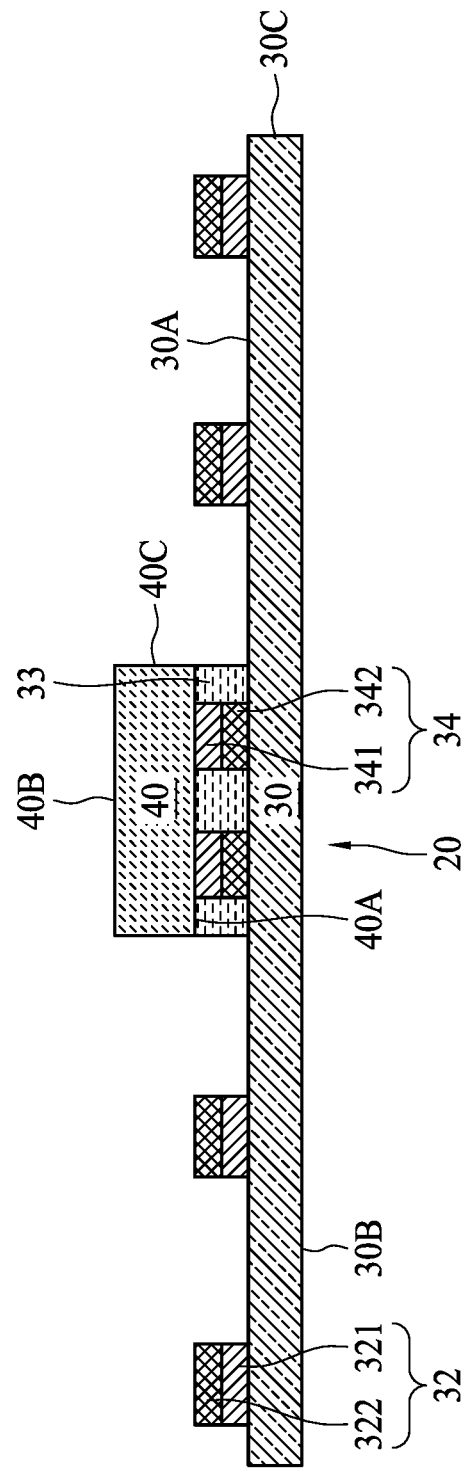

As shown in FIG. 5B, a stacked structure 20 is received. The stacked structure 20 may include a first semiconductor die 30 and at least one second semiconductor die 40 stacked on and electrically connecting the first semiconductor die 40. The first semiconductor die 30 and the second semiconductor die 40 may be bonded by conductive structures 34. In some embodiments, an underfill layer 33 may be formed between the first semiconductor die 30 and the second first semiconductor die 40 and surrounding the conductive structures 34. In some embodiments, the underfill layer 33 may be omitted, for example, when the melting point of the solder 342 of the conductive structure 34 is higher than the melting point of the solder 322 of the interconnection structure 32. The first semiconductor die 30 and the second first semiconductor die 40 may be bonded by direct bonding such as eutectic bonding through the conductive structures 34. For example, the conductive bumps 341 may be formed on the second semiconductor die 40 by e.g., electroplating, and the solders 342 may be formed on the conductive bumps 341 by e.g., electroplating. The first semiconductor die 30 and the second first semiconductor die 40 can be then bonded by a reflow process.

Figure 5C:
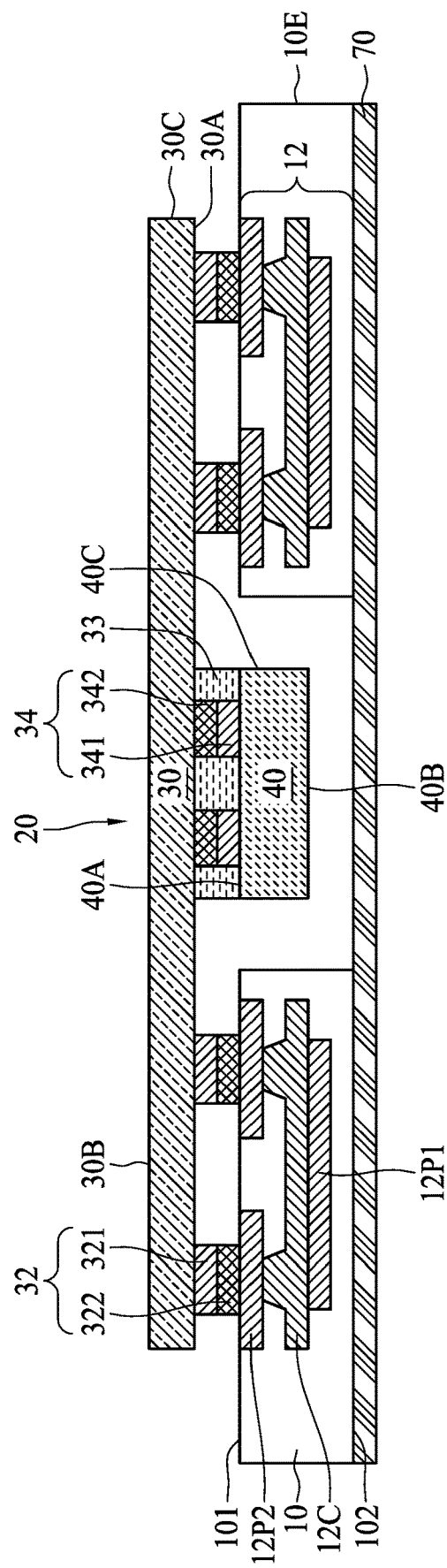

As shown in FIG. 5C, the first semiconductor die 30 is bonded to the first surface 101 of the substrate 10 with the second semiconductor die 40 at least being partially inserted into the cavity 10C. In some embodiments, the first semiconductor die 30 is bonded to the substrate 10 through interconnection structures 32, and electrically connected to the bonding pads 12P2 exposed from the first surface 101 of the substrate 10. The first semiconductor die 30 and the substrate 10 may be bonded by direct bonding such as eutectic bonding through the interconnection structures 32. For example, the conductive bumps 321 may be formed on the first semiconductor die 30 by e.g., electroplating, and the solders 322 may be formed on the conductive bumps 321 by e.g., electroplating. The first semiconductor die 30 and the substrate 10 can be then bonded by a reflow process. The underfill layer 33 surrounding the conductive structures 34 can protect the conductive structures 34 such as the solders 342 of the conductive structures 34 from being deformed during the reflow process of the interconnection structures 32. Alternatively or additionally, the melting point of the solder 342 of the conductive structure 34 is higher than the melting point of the solder 322 of the interconnection structure 32 such that the conductive structures 34 such as the solders 342 of the conductive structures 34 are not melted during the reflow process of the interconnection structures 32.

Figure 5D:
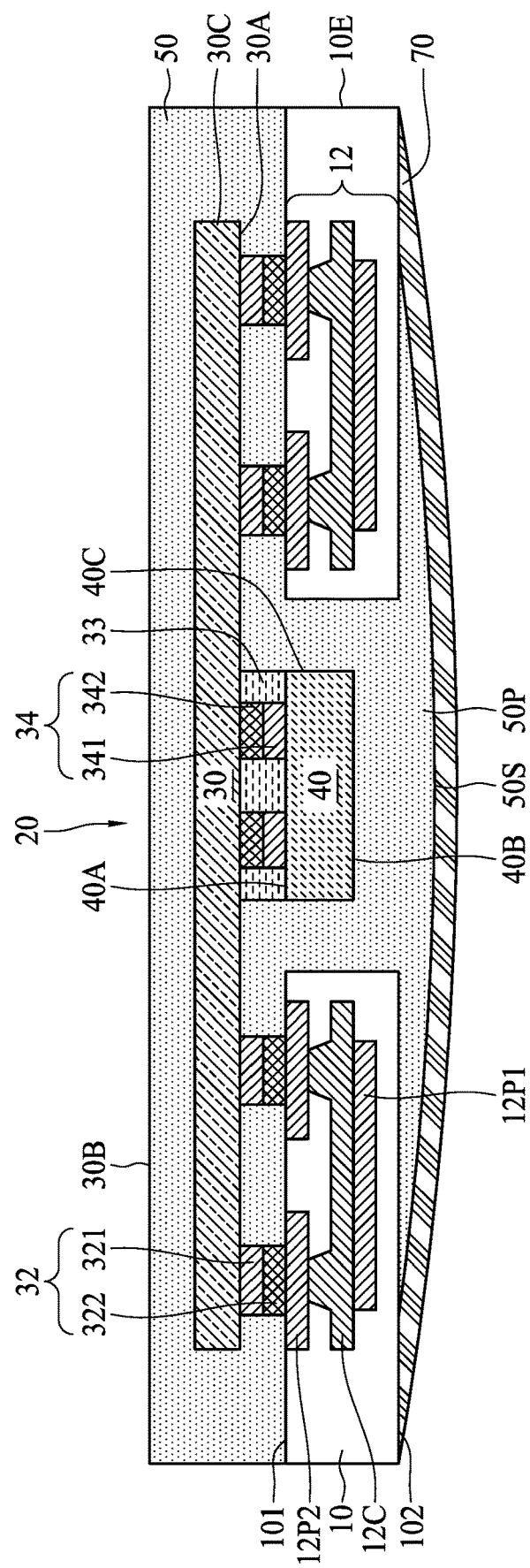

As shown in FIG. 5D, a molding material such as epoxy resin is filled in the cavity 10C to form an encapsulation layer 50 in the cavity 10C to encapsulate the second semiconductor die 40. For example, the encapsulation layer 50 at least encapsulates the passive surface 40B and sidewalls 40C of the second semiconductor die 40. In some embodiments, the encapsulation layer 50 may be substantially leveled with the second surface 102 of the substrate 10. In some embodiments, the molding material can be further formed between the second surface 102 of the substrate 10 and the supporter 70 such that the encapsulation layer 50 may have a protruding portion 50P at least partially covering the second surface 102 of the substrate 10. In some embodiments, the molding material can further expand laterally such that the protruding portion 50P may entirely cover the second surface 102 of the substrate 10. In some embodiments, the molding material with high pressure may push the supporter 70, and form the protruding portion 50P between the supporter 70 and the second surface 102 of the substrate 10 along with formation of the encapsulation layer 50 in the cavity 10C. Since the bonding pads 12P1 of the circuit layer 12 is covered by the substrate 10, the bonding pads 12P1 can be protected from contamination of the molding material.

Figure 5E:
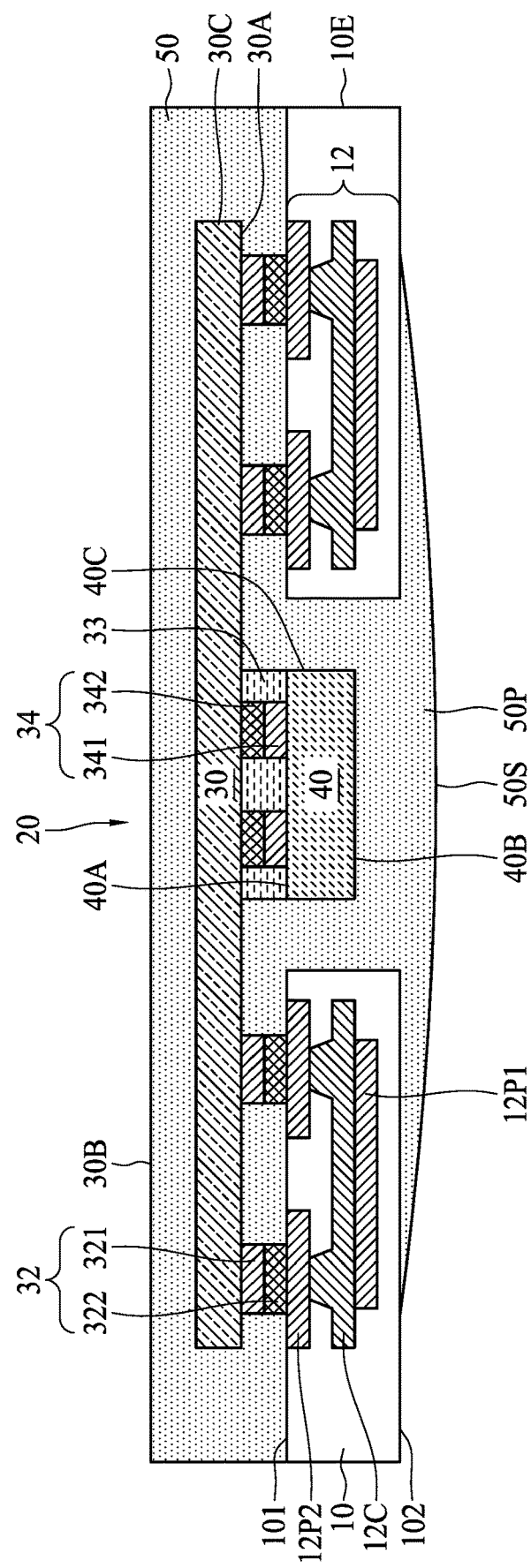

As shown in FIG. 5E, the supporter 70 is removed from the second surface 102 of the substrate 10 subsequent to formation of the encapsulation layer 50. The protruding portion 50P and the substrate 10 are then partially removed from the second surface 102 to form recesses 10R at least partially exposing the circuit layer 12 such as the bonding pads 12P1 to form the semiconductor device package 2D as shown in FIG. 2D. In some embodiments, the protruding portion 50P and the substrate 10 may be partially removed by laser drill. In some other embodiments, the protruding portion 50P and the substrate 10 may be partially removed by mechanical drill, etching or other suitable processes.

Figure 6:
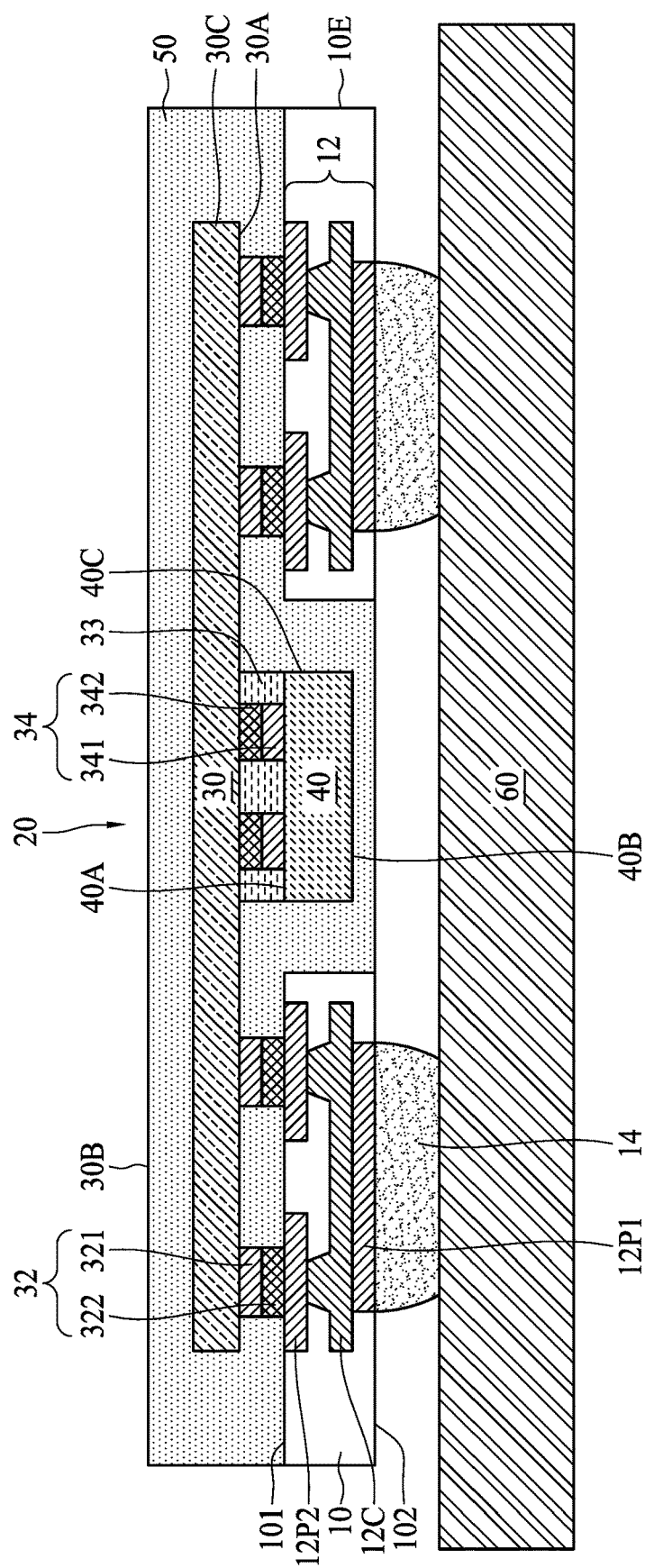
FIG. 6 is a cross-sectional view of a semiconductor device package in accordance with some embodiments of the present disclosure.

FIG. 6 is a cross-sectional view of a semiconductor device package 5 in accordance with some embodiments of the present disclosure. In contrast to the semiconductor device package 1 in FIG. 1, the encapsulation layer 50 of the semiconductor device package 5 may be disposed in the cavity 10C to encapsulating the second semiconductor die 40 without protruding out the cavity 10C. In some embodiments, the encapsulation layer 50 may at least entirely encapsulate the second semiconductor die 40. For example, the encapsulation layer 50 may be substantially leveled with the second surface 102 of the substrate 10. The bonding pads 12P1 may be exposed from the second surface 102 of the substrate 10. In some embodiments, the bonding pads 12P1 may be substantially leveled with the second surface 102 of the substrate 10. In some embodiments, electrical conductors 14 may be disposed on the bonding pads 12P1. In some embodiments, the substrate 10 may be further bonded to a package substrate 60 through the electrical conductor 14.

Figure 7:
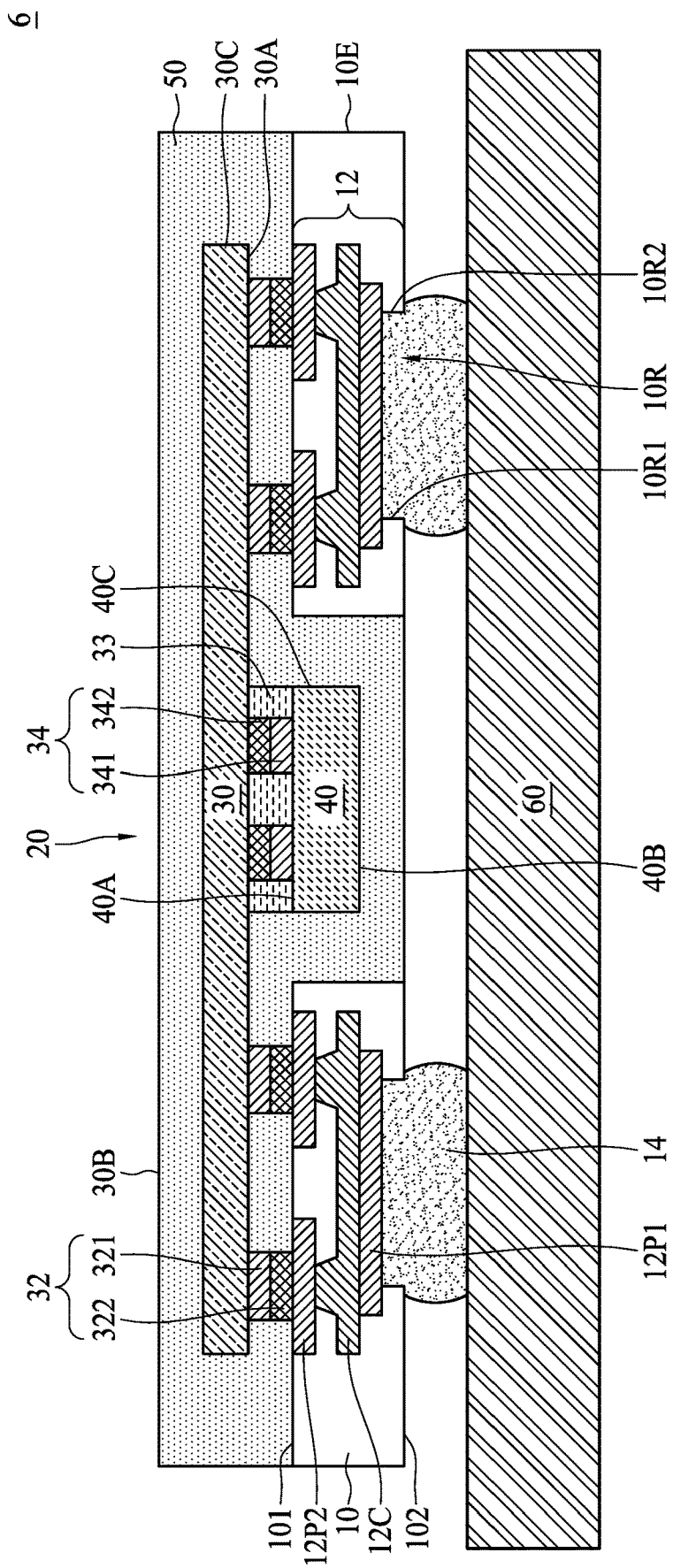
FIG. 7 is a cross-sectional view of a semiconductor device package in accordance with some embodiments of the present disclosure.

FIG. 7 is a cross-sectional view of a semiconductor device package 6 in accordance with some embodiments of the present disclosure. In contrast to the semiconductor device package 5 in FIG. 6, the bonding pads 12P1 may be exposed from the second surface 102 of the substrate 10 through the recesses 10R.

Figure 8A:
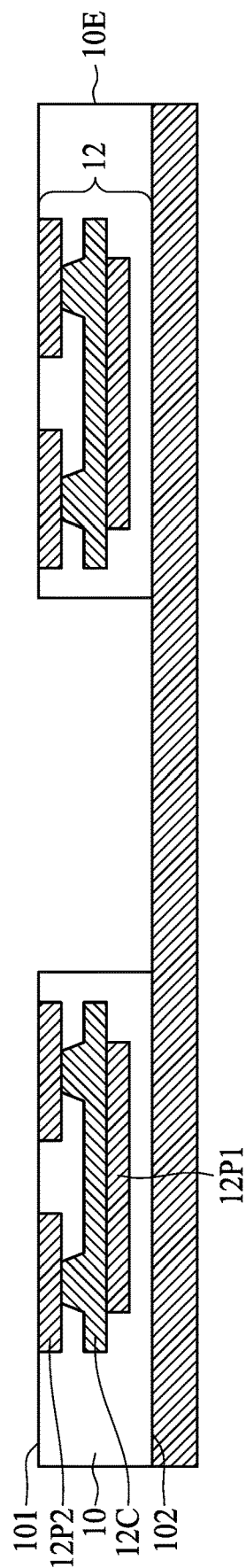
FIG. 8A, FIG. 8B, FIG. 8C, FIG. 8D and FIG. 8E illustrate operations of manufacturing a semiconductor device package in accordance with some embodiments of the present disclosure.

FIG. 8A, FIG. 8B, FIG. 8C, FIG. 8D and FIG. 8E illustrate operations of manufacturing a semiconductor device package in accordance with some embodiments of the present disclosure. As shown in FIG. 8A, a substrate 10 is received. The substrate 10 may include pre-formed circuit layer 12. The substrate 10 defines at least one cavity 10C through the substrate 10. The substrate 10 may further include an embedded circuit layer 12. The circuit layer 12 may include bonding pads 12P1 adjacent to a second surface 102 of the substrate 10, and bonding pads 12P2 adjacent to a first surface 101 of the substrate 10. In some embodiments, the bonding pads 12P1 are embedded in the substrate 10, and unexposed from the second surface 102. In some other embodiments, the bonding pads 12P1 may be exposed from the second surface 102 of the substrate 10. The bonding pads 12P2 may be exposed from the first surface 101 of the substrate 10. In some embodiments, a supporter 70 is attached to the second surface 102 of the substrate 10 to seal a bottom of the cavity 10C. In some embodiments, the supporter 70 may include, but is not limited to be, a rigid supporter. For example, the rigid supporter may include a metal film such as copper foil.

Figure 8B:
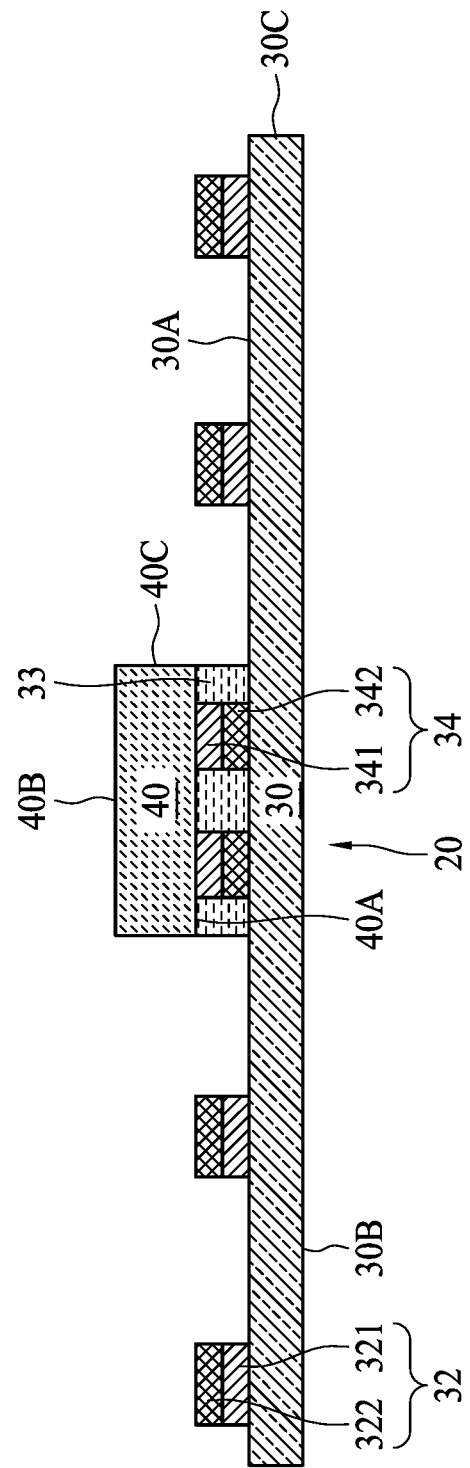

As shown in FIG. 8B, a stacked structure 20 is received. The stacked structure 20 may include a first semiconductor die 30 and at least one second semiconductor die 40 stacked on and electrically connecting the first semiconductor die 40. The first semiconductor die 30 and the second semiconductor die 40 may be bonded by conductive structures 34. In some embodiments, an underfill layer 33 may be formed between the first semiconductor die 30 and the second first semiconductor die 40 and surrounding the conductive structures 34. In some embodiments, the underfill layer 33 may be omitted, for example, when the melting point of the solder 342 of the conductive structure 34 is higher than the melting point of the solder 322 of the interconnection structure 32. The first semiconductor die 30 and the second first semiconductor die 40 may be bonded by direct bonding such as eutectic bonding through the conductive structures 34. For example, the conductive bumps 341 may be formed on the second semiconductor die 40 by e.g., electroplating, and the solders 342 may be formed on the conductive bumps 341 by e.g., electroplating. The first semiconductor die 30 and the second first semiconductor die 40 can be then bonded by a reflow process.

Figure 8C:
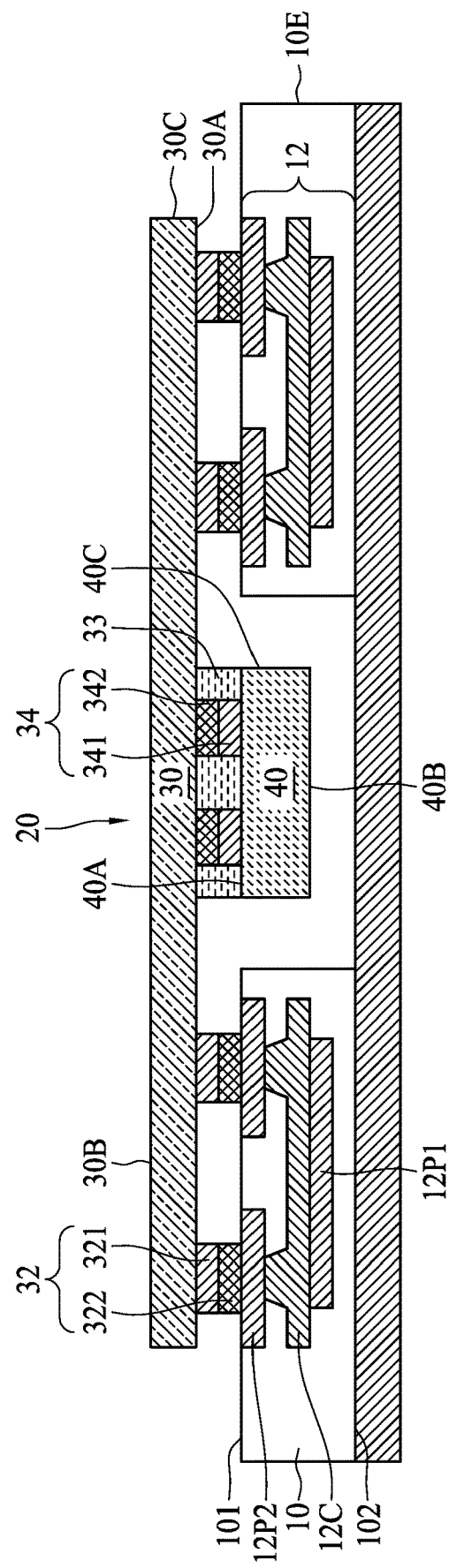

As shown in FIG. 8C, the first semiconductor die 30 is bonded to the first surface 101 of the substrate 10 with the second semiconductor die 40 at least being partially inserted into the cavity 10C. In some embodiments, the first semiconductor die 30 is bonded to the substrate 10 through interconnection structures 32, and electrically connected to the bonding pads 12P2 exposed from the first surface 101 of the substrate 10. The first semiconductor die 30 and the substrate 10 may be bonded by direct bonding such as eutectic bonding through the interconnection structures 32. For example, the conductive bumps 321 may be formed on the first semiconductor die 30 by e.g., electroplating, and the solders 322 may be formed on the conductive bumps 321 by e.g., electroplating. The first semiconductor die 30 and the substrate 10 can be then bonded by a reflow process. The underfill layer 33 surrounding the conductive structures 34 can protect the conductive structures 34 such as the solders 342 of the conductive structures 34 from being deformed during the reflow process of the interconnection structures 32. Alternatively or additionally, the melting point of the solder 342 of the conductive structure 34 is higher than the melting point of the solder 322 of the interconnection structure 32 such that the conductive structures 34 such as the solders 342 of the conductive structures 34 are not melted during the reflow process of the interconnection structures 32.

Figure 8D:
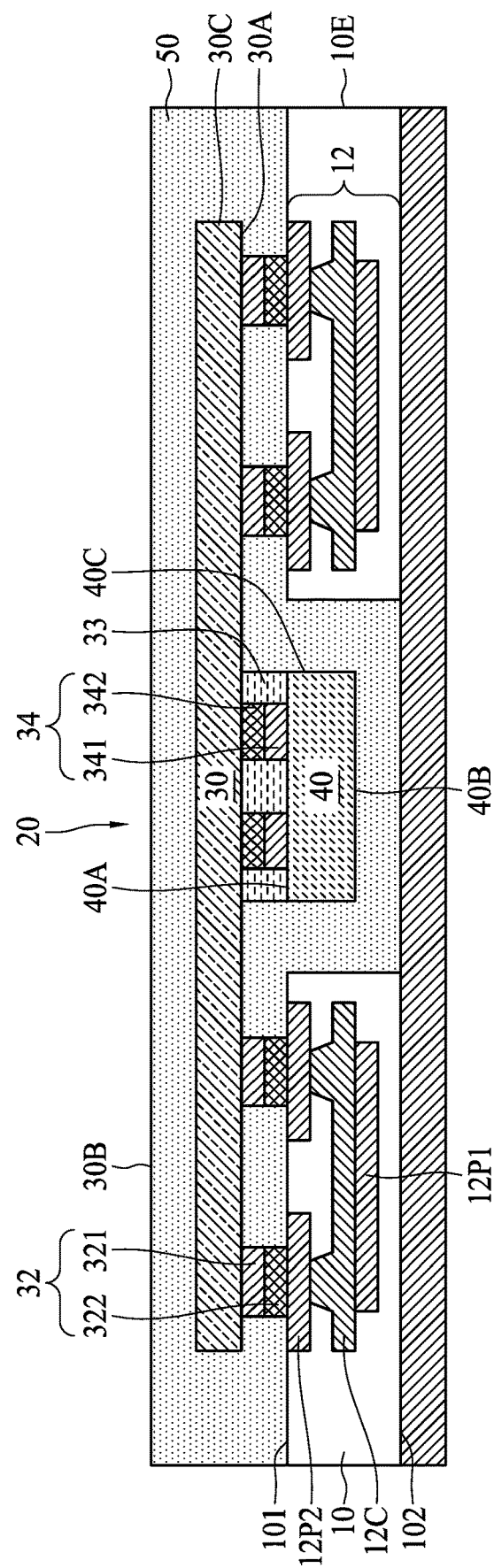

As shown in FIG. 8D, a molding material such as epoxy resin is filled in the cavity 10C to form an encapsulation layer 50 in the cavity 10C to at least entirely encapsulate the second semiconductor die 40. For example, the encapsulation layer 50 at least encapsulates the passive surface 40B and sidewalls 40C of the second semiconductor die 40. In some embodiments, the encapsulation layer 50 may be blocked by the supporter 70 and substantially leveled with the second surface 102 of the substrate 10.

Figure 8E:
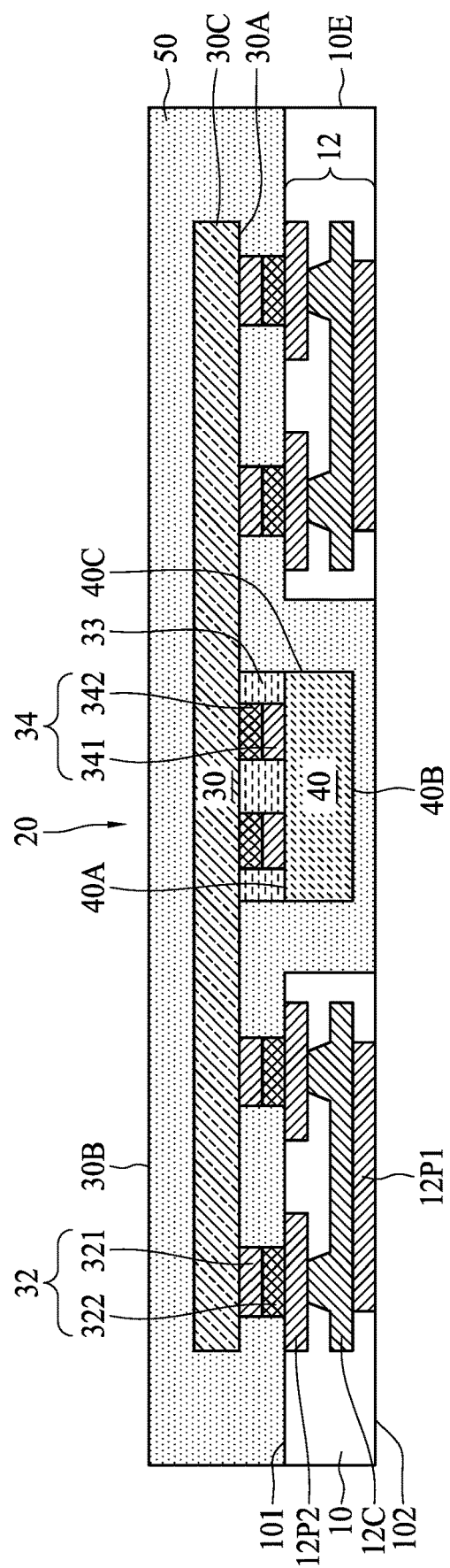

As shown in FIG. 8E, the supporter 70 is removed from the second surface 102 of the substrate 10 subsequent to formation of the encapsulation layer 50. In some embodiments, the bonding pads 12P1 are embedded in the substrate 10 subsequent to removal of the supporter 70, and a thinning process may be performed on the second surface 102 of the substrate 10 to expose the bonding pads 12P1 to form the semiconductor device package 5 as shown in FIG. 6. The thinning process may include etching, grinding or other suitable processes. In some other embodiments, the bonding pads 12P1 may be exposed from the second surface 102 of the substrate 10 prior to removal of the supporter 70, and the thinning process may be omitted. In some embodiments, electrical conductors 14 may be formed on the bonding pads 12P1. In some embodiments, the substrate 10 may be further bonded to a package substrate 60 through the electrical conductor 14. In some other embodiments, a patterning process may be performed on the substrate 10 subsequent to removal of the supporter 70 to form recesses 10R exposing the bonding pads 12P1. Accordingly, the semiconductor device package 6 as shown in FIG. 7 can be formed.

In some embodiments of the present disclosure, the semiconductor device package includes the stacked structure partially inserted into the cavity of the substrate such that the thickness of the semiconductor device package can be reduced. The stacked structure is encapsulated and protected by the encapsulation layer, and thus the reliability of the semiconductor device package can be improved. The stacked structure includes the first semiconductor die 30 and the second semiconductor die 40 stacked to and electrically connected to each other. The electrical connection between the first semiconductor die and the second semiconductor dies may be a substrate-free connection in which additional interposer or interconnection substrate may be omitted, and thus manufacturing costs can be reduced. Accordingly, the electrical transmission path of the stacked structure can be shortened, the thickness of the semiconductor device package can be further reduced, and the I/O connections can be increased.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale.

There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a substrate comprising a circuit layer, the substrate including a first surface and a second surface opposite to the first surface, wherein the substrate defines at least one cavity through the substrate, at least one recess recessed from the second surface and partially exposing the circuit layer, and a bottom surface of the circuit layer in the recess is recessed from the second surface of the substrate;
   a stacked structure comprising:
      a first semiconductor die disposed on the first surface and electrically connected on the circuit layer;
      at least one second semiconductor die stacked on the first semiconductor die and electrically connected to the first semiconductor die, wherein the second semiconductor die is at least partially inserted into the cavity;
   an encapsulation layer disposed in the cavity and at least encapsulating the second semiconductor die and at least a portion of a sidewall of the first semiconductor die, wherein the encapsulation layer further comprises a protruding portion protruding out the cavity and partially covering the second surface of the substrate; and
   an electrical conductor extending from the second surface of the substrate into the recess of the substrate, and contacting the bottom surface of the circuit layer.

2. The semiconductor device package of claim 1, wherein the protruding portion of the encapsulation layer includes a through hole connected to the recess of the substrate, the recess includes a first lateral edge proximal to the cavity, a first edge of the through hole of the protruding portion of the encapsulation layer is substantially coplanar with the first lateral edge of the recess, and the electrical conductor is in contact with the first edge of the through hole.

3. The semiconductor device package of claim 2, wherein the recess further includes a second lateral edge distal to the cavity, and the protruding portion is further disposed between the second lateral edge of the recess and a perimeter of the substrate.

4. The semiconductor device package of claim 3, wherein a second edge of protruding portion of the encapsulation layer is substantially aligned with the second lateral edge of the recess.

5. The semiconductor device package of claim 1, wherein the protruding portion of the encapsulation layer includes a non-planar surface, and the electrical conductor is in contact with the non-planar surface of the protruding portion of the encapsulation layer.

6. The semiconductor device package of claim 1, further comprising a plurality of interconnection structures disposed between the substrate and the first semiconductor die, and electrically connecting first semiconductor die to the circuit layer.

7. The semiconductor device package of claim 6, wherein an active surface of the first semiconductor die faces an active surface of the second semiconductor die, and the semiconductor device package further comprises a plurality of conductive structures disposed between the active surface of the second semiconductor die and the active surface of the first semiconductor die, and electrically connecting the second semiconductor die to the first semiconductor die.

8. The semiconductor device package of claim 7, wherein a melting point of the conductive structures is higher than a melting point of the interconnection structures.

9. The semiconductor device package of claim 7, further comprising an underfill layer disposed between the active surface of the second semiconductor die and the active surface of the first semiconductor die, and surrounding the conductive structures.

10. The semiconductor device package of claim 1, wherein an active surface of the first semiconductor die faces a passive surface of the second semiconductor die, and the semiconductor device package further comprises a plurality of bonding wires electrically connecting the second semiconductor die to the first semiconductor die.

11. The semiconductor device package of claim 1, wherein the at least one second semiconductor die comprises a plurality of second semiconductor dies disposed side by side on the first semiconductor die.

12. The semiconductor device package of claim 1, wherein the at least one second semiconductor die comprises a plurality of second semiconductor dies stacked on each other.

13. The semiconductor device package of claim 1, wherein the circuit layer comprises a bonding pad partially exposed from the second surface through the recess, and the bonding pad partially overlapping with the protruding portion of the encapsulation layer in a vertical projection direction.

14. A semiconductor device package, comprising:
 a substrate comprising a circuit layer, the substrate including a first surface and a second surface opposite to the first surface, wherein the substrate defines at least one cavity through the substrate;
 a stacked structure comprising:
  a first semiconductor die disposed on the first surface and electrically connected on the circuit layer;
  at least one second semiconductor die stacked on the first semiconductor die and electrically connected to the first semiconductor die, wherein the second semiconductor die is at least partially inserted into the cavity;
 an encapsulation layer disposed in the cavity, at least entirely encapsulating the second semiconductor die and at least a portion of a sidewall of the first semiconductor die, wherein the encapsulation layer includes a through hole exposing the circuit layer; and
 an electrical conductor disposed in the through hole and in contact with the circuit layer.

15. The semiconductor device package of claim 14, wherein a surface of the encapsulation layer is substantially leveled with the second surface of the substrate.

16. The semiconductor device package of claim 14, wherein the circuit layer comprises a bonding pad exposed from the second surface, and a surface of the bonding pad is substantially leveled with or recessed from the second surface.

17. A method of manufacturing a semiconductor device package, comprising:
 receiving a substrate defining a cavity;
 receiving a stacked structure comprising a first semiconductor die and at least one second semiconductor die stacked on the first semiconductor die;
 bonding the first semiconductor die to a first surface of the substrate with the second semiconductor die at least being partially inserted into the cavity;
 filling a molding material in the cavity to form an encapsulation layer in the cavity to at least entirely encapsulate the second semiconductor die subsequent to bonding the first semiconductor die to the first surface of the substrate with the second semiconductor die at least being partially inserted into the cavity;
 forming a recess from the second surface of the substrate to expose a bonding pad of a circuit layer of the substrate; and
 forming an electrical conductor in the recess and in contact with the bonding pad.

18. The method of claim 17, further comprising:
 attaching a supporter to a second surface of the substrate to seal a bottom of the cavity; and
 filling the molding material in the cavity from the first surface of the substrate to form the encapsulation layer.

19. The method of claim 18, wherein the supporter comprises a flexible supporter, and the method further comprises:
 forming the molding material between the second surface of the substrate and the flexible supporter;
 removing the flexible supporter from the second surface of the substrate subsequent to filling the molding material in the cavity; and
 forming a through hole in the molding material to expose the recess prior to forming the electrical conductor.

20. The method of claim 19, wherein the through hole of the molding material and the recess of the substrate are formed by laser drilling.

21. The method of claim 18, wherein the supporter comprises a rigid supporter, and the method further comprises:
 removing the rigid supporter from the second surface of the substrate subsequent to filling the molding material in the cavity; and
 thinning the substrate from the second surface to expose a circuit layer of the substrate.

* * * * *